(12) United States Patent
Needleman et al.

(10) Patent No.: US 12,218,265 B2
(45) Date of Patent: Feb. 4, 2025

(54) METHODS AND SYSTEMS FOR PHOTOVOLTAIC DEVICES USING SILICON PARTICLES

(71) Applicant: LEAP PHOTOVOLTAICS INC., San Francisco, CA (US)

(72) Inventors: David Berney Needleman, San Francisco, CA (US); Matthew Robinson, San Francisco, CA (US); Nathanael Fehrenbach, Berkeley, CA (US); Jimmy Mei, San Ramon, CA (US); Arnaud Lepert, Belmont, CA (US)

(73) Assignee: LEAP PHOTOVOLTAICS INC., San Francisco, CA (US)

( * ) Notice: Subject to any disclaimer, the term of this patent is extended or adjusted under 35 U.S.C. 154(b) by 87 days.

(21) Appl. No.: 17/931,462

(22) Filed: Sep. 12, 2022

(65) Prior Publication Data
US 2023/0081214 A1    Mar. 16, 2023

Related U.S. Application Data

(60) Provisional application No. 63/242,960, filed on Sep. 10, 2021.

(51) Int. Cl.
*H01L 31/0747* (2012.01)
*H01L 31/0224* (2006.01)
(Continued)

(52) U.S. Cl.
CPC .. *H01L 31/0747* (2013.01); *H01L 31/022466* (2013.01); *H01L 31/074* (2013.01);
(Continued)

(58) Field of Classification Search
CPC ............... H01L 31/074; H01L 31/0747; H01L 31/1804; H01L 31/1884; H01L 31/202
See application file for complete search history.

(56) References Cited

U.S. PATENT DOCUMENTS

| 6,762,359 B2 * | 7/2004 | Asai ..................... H01L 31/042 257/466 |
| 2004/0016456 A1 | 1/2004 | Murozono et al. |

(Continued)

FOREIGN PATENT DOCUMENTS

| JP | 2007149796 A | 6/2007 |
| KR | 20130007497 A | 1/2013 |

OTHER PUBLICATIONS

International Preliminary Report for PCT/US2022/043245 dated Mar. 21, 2024, 5 pages.

*Primary Examiner* — Mayla Gonzalez Ramos
(74) *Attorney, Agent, or Firm* — DICKINSON WRIGHT PLLC

(57) ABSTRACT

Photovoltaic devices and methods for fabricating a photovoltaic devices. The method includes applying a coating layer that surrounds each of a plurality of silicon particles. The method also includes implanting the plurality of silicon particles into a substrate layer such that an exposed portion of each of the plurality of silicon particles extends away from a surface of the substrate layer. The method further includes removing a portion of the coating layer that is positioned around the exposed portion of each of the plurality of silicon particles. The method also includes placing an insulator layer on the surface of the substrate layer. The method further includes placing a selective carrier transport layer on the exposed portion of each of the plurality of silicon particles.

16 Claims, 18 Drawing Sheets

(51) Int. Cl.
*H01L 31/074* (2012.01)
*H01L 31/18* (2006.01)
*H01L 31/20* (2006.01)

(52) U.S. Cl.
CPC ...... *H01L 31/1804* (2013.01); *H01L 31/1884* (2013.01); *H01L 31/202* (2013.01)

(56) References Cited

U.S. PATENT DOCUMENTS

| | | | |
|---|---|---|---|
| 2005/0236030 A1* | 10/2005 | Sugawara | H01L 31/035281 136/250 |
| 2013/0092975 A1 | 4/2013 | Jain | |
| 2013/0153027 A1* | 6/2013 | Youngbull | H01L 31/035281 438/69 |
| 2019/0371949 A1* | 12/2019 | Ahn | H01L 31/0547 |

* cited by examiner

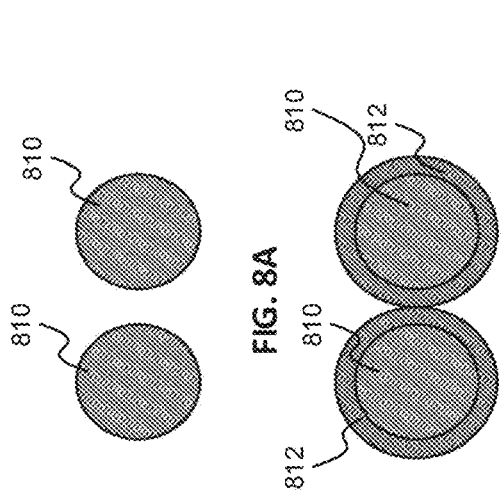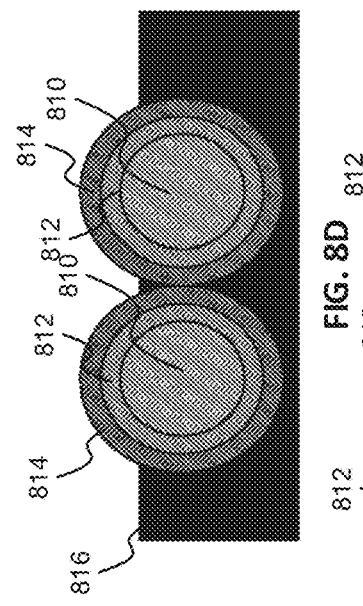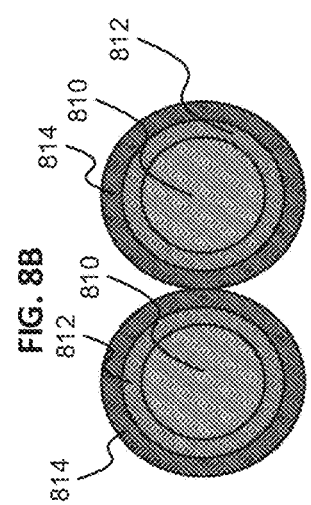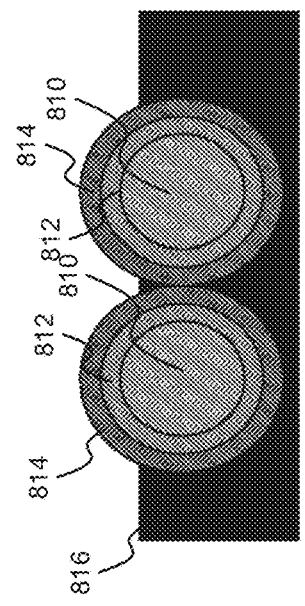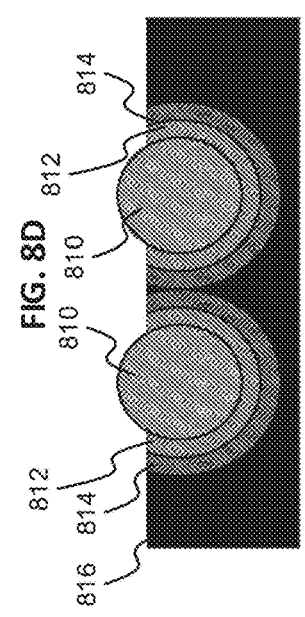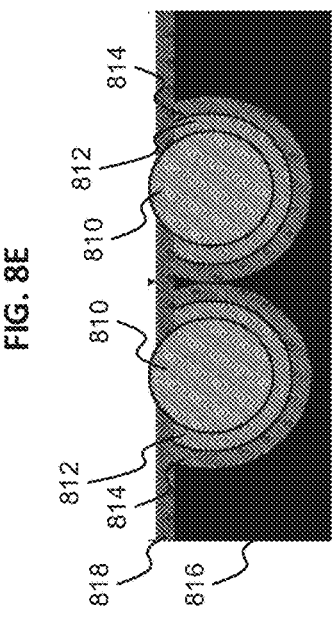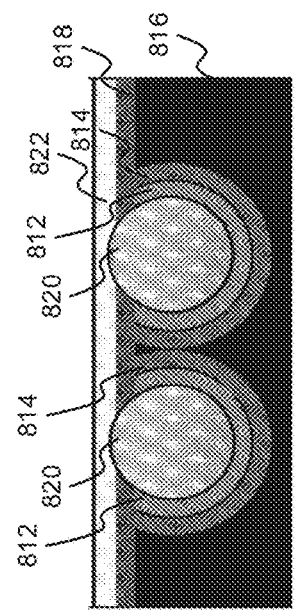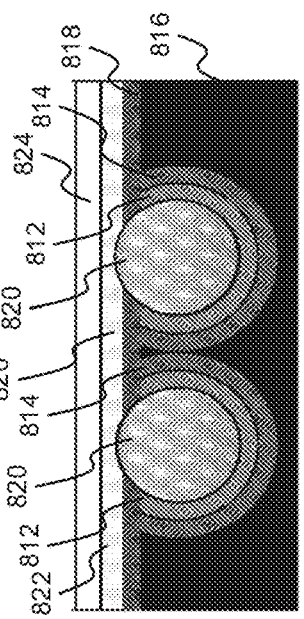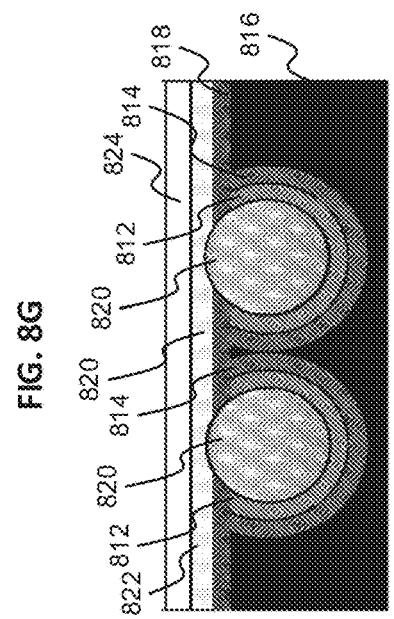

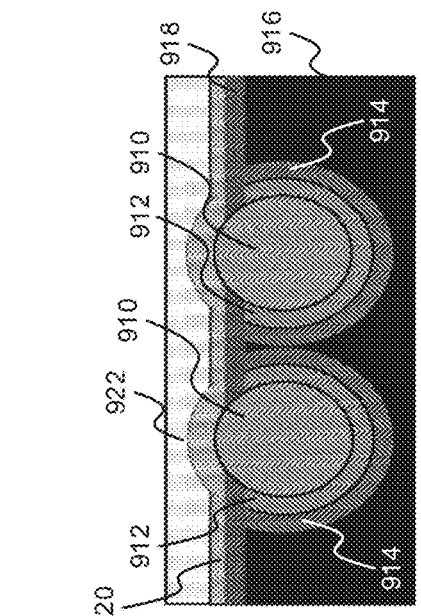
FIG. 9G
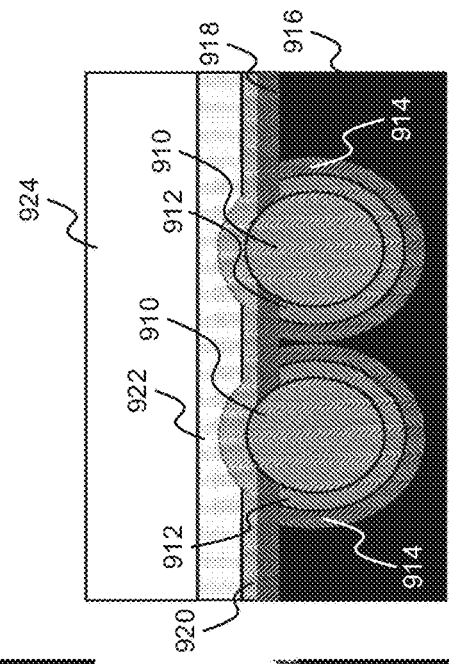
FIG. 9H
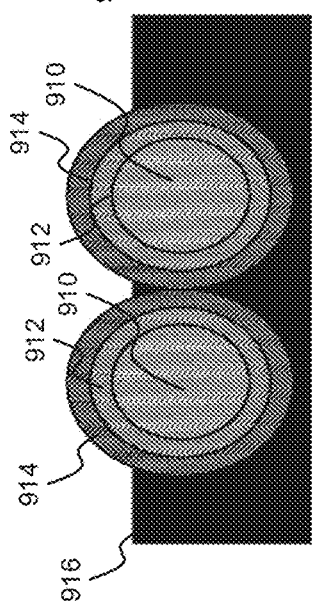
FIG. 9D
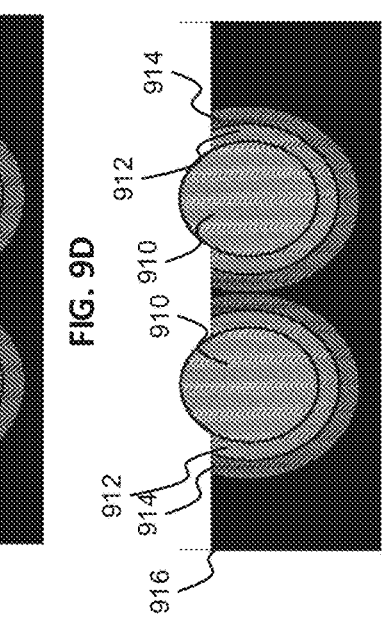
FIG. 9E
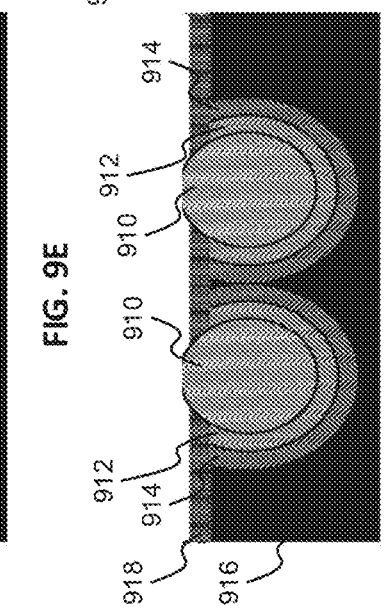
FIG. 9F
FIG. 9A
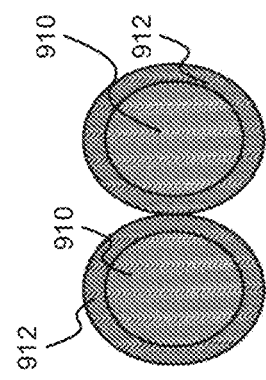
FIG. 9B
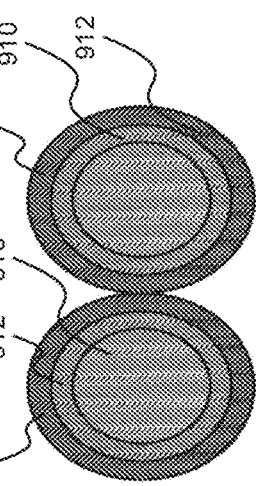
FIG. 9C

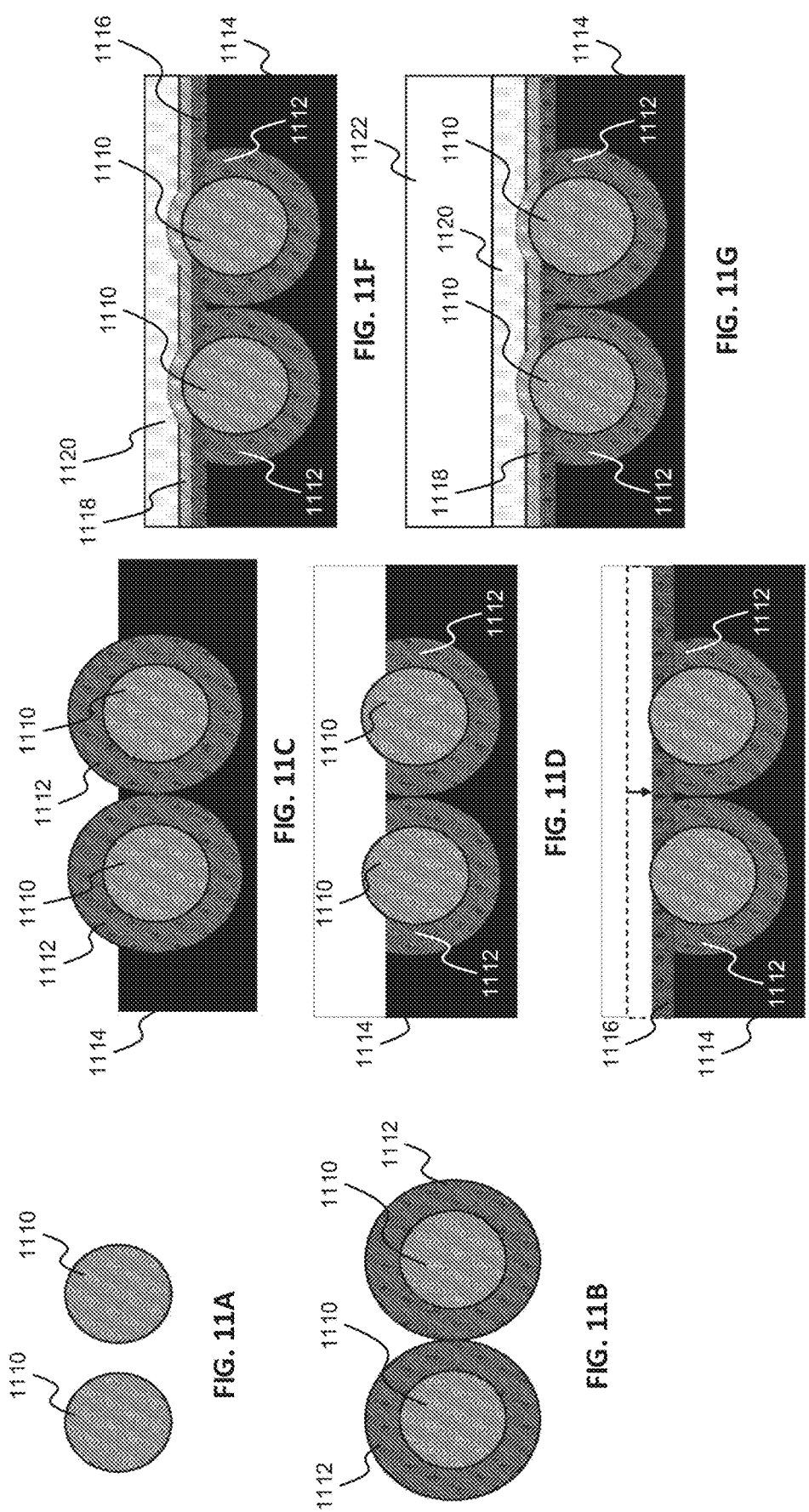

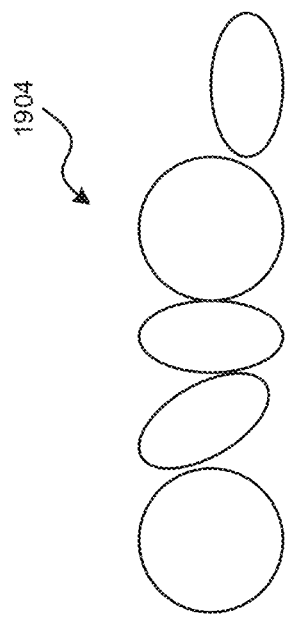
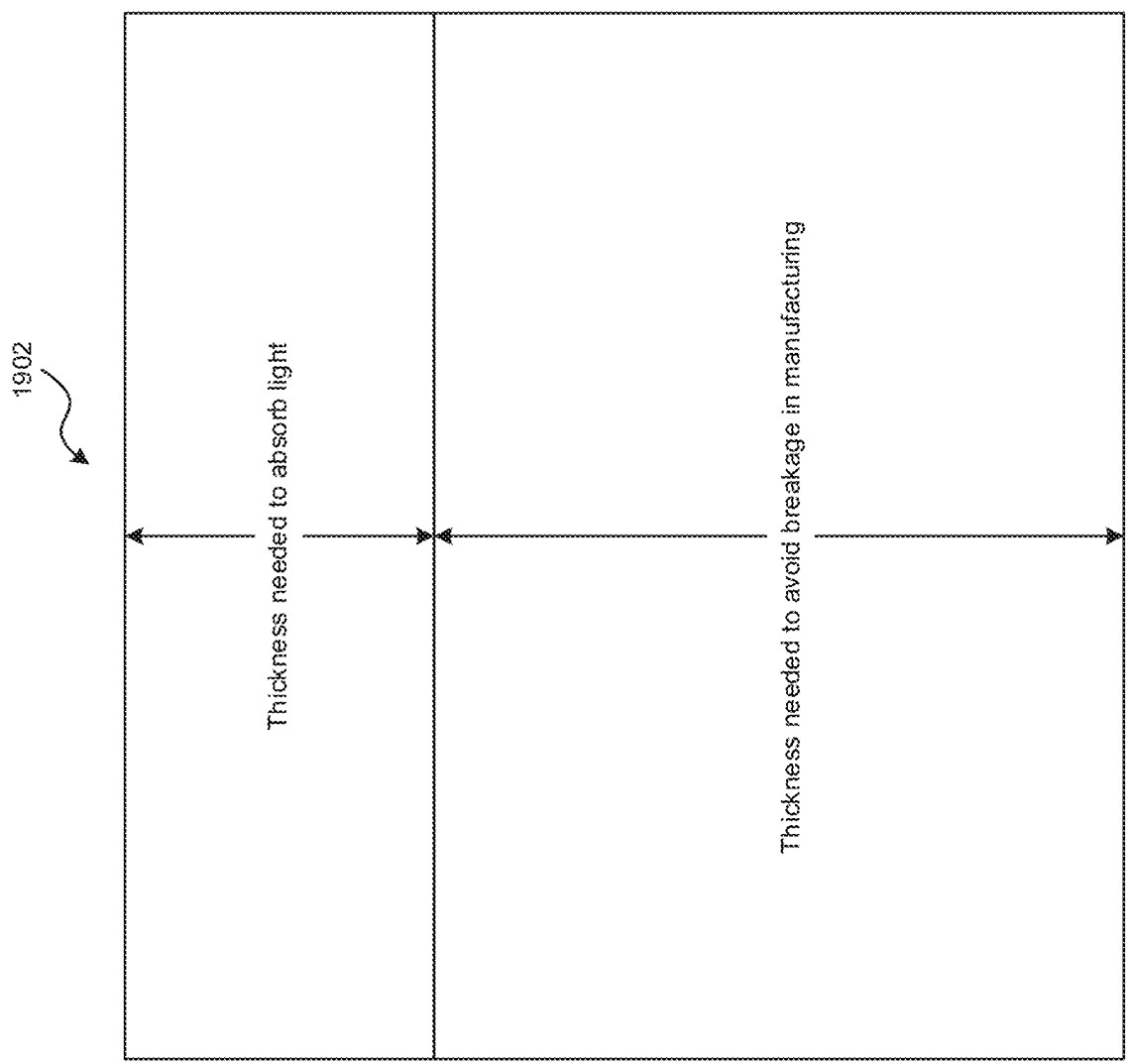
FIG. 19

METHODS AND SYSTEMS FOR PHOTOVOLTAIC DEVICES USING SILICON PARTICLES

CROSS-REFERENCE TO RELATED APPLICATIONS

This application claims priority to and the benefit of U.S. Provisional Application Ser. No. 63/242,960, filed Sep. 10, 2021, titled "methods and system for photovoltaic devices using silicon particles," the entire disclosure of which is hereby incorporated by reference.

BACKGROUND

Photovoltaics is the direct conversion of light into electric power using semiconducting materials like silicon. Solar cells containing semiconducting materials, like silicon, use the photovoltaic effect to generate voltage and electric current when these materials are exposed to sunlight. The photovoltaic absorbers material then transports the resulting charge carriers to electrical contacts.

The absorber material is typically manufactured using silicon wafers cut from bulk material with wire saws. However, the sawing process results in a substantial loss of material, and the wafers are rigid and fragile, which requires the use of inflexible substrates, glass, and/or metal frames. This manufacturing process is also expensive and requires extensive energy input because of the variety of equipment that must be utilized to manufacture the wafers. Further, traditional uses of silicon photovoltaic modules are limited in their potential applications because of the fixed form factor, rigidity, and fragility of the wafers.

SUMMARY

The implementations described herein relate to methods and systems related to photovoltaic devices. In particular, high-efficiency photovoltaic conversion devices are provided using small silicon particles, also referred to as silicon particles, deposited onto a substrate. The use of small silicon particles rather than silicon wafers can dramatically reduce the equipment, energy, and cost of producing the photovoltaic absorber without losing the key features that make silicon photovoltaic modules appealing (high-efficiency, non-toxic, reliable, bankable). Furthermore, the use of particles rather than wafers enables the use of a flexible substrate and laminate with no glass or metal frame in some implementations. This combination produces a lightweight, flexible module that will make transport and installation faster and less expensive in traditional applications like ground-mounted and roof arrays as well as enabling new applications including mobile and building-integrated systems. The implementations described in the present disclosure enable lower-cost, higher-efficiency photovoltaic devices with silicon particle absorbers than conventional designs by using smaller silicon particles (e.g., less than 100 micrometers in size), passivating the surfaces of these particles, making contacts with higher electronic carrier selectivity and lower contact resistance, adding a thin-film anti-reflection coating, combinations thereof, and the like.

The use of small silicon particles, for example, particles characterized by dimensions, including diameter less than 100 micrometers, enable less material to be used, reducing cost and energy for silicon production. The small particle size also allows the minority carrier diffusion length and minority carrier recombination lifetime to be shorter to achieve the same power conversion efficiency. The small particle size also allows the crystal grains to be small while each particle remains composed of a single crystal (i.e., monocrystalline). The small particle size also increases the carrier concentration (and thereby operating voltage) of the device.

The present disclosure provides a method for fabricating a photovoltaic device. The method includes applying a coating layer that surrounds each of a plurality of silicon particles. The method also includes implanting the plurality of silicon particles into a substrate layer such that an exposed portion of each of the plurality of silicon particles extends away from a surface of the substrate layer. The method further includes removing a portion of the coating layer that is positioned around the exposed portion of each of the plurality of silicon particles. The method also includes placing an insulator layer on the surface of the substrate layer. The method further includes placing a selective carrier transport layer on the exposed portion of each of the plurality of silicon particles.

The present disclosure also provides a photovoltaic device including, in one implementation, a substrate layer, a plurality of silicon particles, a coating layer, an insulator layer, and a selective carrier transport layer. The substrate layer includes a surface. The plurality of silicon particles are implanted in the substrate layer such that an exposed portion of each of the plurality of silicon particles extends away from the surface of the substrate layer. The coating layer is positioned between each of the plurality of silicon particles and the substrate layer. The insulator layer is positioned on the surface of the substrate layer. The selective carrier transport layer is positioned on the exposed portion of each of the plurality of the silicon particles.

The present disclosure further provides a method for fabricating a photovoltaic device. The method includes applying a coating layer that surrounds each of a plurality of silicon particles. The method also includes implanting the plurality of silicon particles into a substrate layer such that an exposed portion of each of the plurality of silicon particles extends away from a surface of the substrate layer. The method further includes placing an insulator layer on the surface of the substrate layer and on the exposed portion of each of the plurality of the silicon particles. The method also includes removing a portion of the insulator layer that is positioned around a portion of the coating layer that is positioned around the exposed portion of each of the plurality of silicon particles. The method further includes generating a selective carrier transport layer by counter-doping a first portion of the coating layer to be an opposite polarity from a second portion of the coating layer. The first portion of the coating layer is positioned around the exposed portion of each of the plurality of silicon particles. The second portion of the coating layer is implanted in the substrate layer.

Other technical features may be readily apparent to one skilled in the art from the following figures, descriptions, and claims.

BRIEF DESCRIPTION OF THE DRAWINGS

For a more complete understanding of the present disclosure and its advantages, reference is now made to the following description, taken in conjunction with the accompanying drawings. It is emphasized that, according to common practice, the various features of the drawings are not necessarily to-scale. On the contrary, the dimensions of the various features may be—and typically are—arbitrarily expanded or reduced for the purpose of clarity.

FIGS. 8A-8H are flow chart diagrams illustrating a method for fabricating a photovoltaic device using counter-doping, in accordance with some implementations of the present disclosure.

FIGS. 9A-9H are flow chart diagrams illustrating a method for fabricating a photovoltaic device using silicon particles, in accordance with some implementations of the present disclosure.

FIGS. 11A-11G are flow chart diagrams illustrating a method for fabricating a photovoltaic device using silicon particles, in accordance with some implementations of the present disclosure.

FIG. 19 is a sectional view of a silicon wafer and a plurality of silicon particles, in accordance with some implementations of the present disclosure.

NOTATION AND NOMENCLATURE

Figures 1A, 1B, 1C, 1D, 1E, 1F, 1G, 1H, 1I:
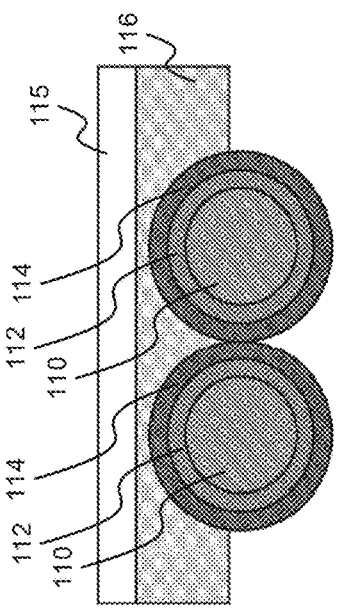
FIGS. 1A-1I are flow chart diagrams illustrating a method for fabricating a photovoltaic device using silicon particles, in accordance with some implementations of the present disclosure.

Various terms are used to refer to particular system components. A particular component may be referred to commercially or otherwise by different names. Further, a particular component (or the same or similar component) may be referred to commercially or otherwise by different names. Consistent with this, nothing in the present disclosure shall be deemed to distinguish between components that differ only in name but not in function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

The terminology used herein is for the purpose of describing particular example implementations only, and is not intended to be limiting. As used herein, the singular forms "a," "an," and "the" may be intended to include the plural forms as well, unless the context clearly indicates otherwise. The method steps, processes, and operations described herein are not to be construed as necessarily requiring their performance in the particular order discussed or illustrated, unless specifically identified as an order of performance. It is also to be understood that additional or alternative steps may be employed.

The terms first, second, third, etc. may be used herein to describe various elements, components, regions, layers and/or sections; however, these elements, components, regions, layers and/or sections should not be limited by these terms. These terms may be only used to distinguish one element, component, region, layer, or section from another region, layer, or section. Terms such as "first," "second," and other numerical terms, when used herein, do not imply a sequence or order unless clearly indicated by the context. Thus, a first element, component, region, layer, or section discussed below could be termed a second element, component, region, layer, or section without departing from the teachings of the example implementations. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C. In another example, the phrase "one or more" when used with a list of items means there may be one item or any suitable number of items exceeding one.

Spatially relative terms, such as "inner," "outer," "beneath," "below," "lower," "above," "up," "upper," "top," "bottom," "down," "inside," "outside," "contained within," "superimposing upon," and the like, may be used herein. These spatially relative terms can be used for ease of description to describe one element's or feature's relationship to another element(s) or feature(s) as illustrated in the figures. The spatially relative terms may also be intended to encompass different orientations of the device in use, or operation, in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

DETAILED DESCRIPTION

The following discussion is directed to various implementations of the present disclosure. Although one or more of these implementations may be preferred, the implementations disclosed should not be interpreted, or otherwise used, as limiting the scope of the present disclosure, including the claims. In addition, one skilled in the art will understand that the following description has broad application, and the discussion of any implementation is meant only to be exemplary of that implementation, and not intended to intimate that the scope of the disclosure, including the claims, is limited to that implementation.

The limitations of conventional silicon photovoltaic modules manufactured using silicon wafers demonstrates the need for a less equipment-intensive, less wasteful, and less expensive manufacturing process. The ability to utilize solar cells in applications where a rigid solar module would be inapplicable is also desirable.

The present disclosure describes implementations of enabling deposition of a material (e.g., $SiO_2$, $Al_2O_3$, $SiN_x$, $TiO_2$, amorphous silicon, polysilicon etc.) on the silicon particles, also referred to as particles, (either before or after the particles are deposited on a substrate) for the purpose of electrically passivating the surface. In some implementations, passivation reduces the electronic carrier recombination at the surface of the silicon particles or interface between the silicon particles and other materials. This reduction can occur chemically by reducing the number of midgap electronic states available to electrons, e.g., by bonding the silicon atoms at the surface to other elements like oxygen or hydrogen, or by reducing bond strain in silicon-silicon bonds. Reduction can also occur due to a field effect due to fixed charges in the passivating layer. Reduction can also occur by changing the mobility of one carrier type near the surface or interface (e.g., by diffusing dopants into the region just below this surface or interface). Reduction can also occur through a combination of these effects.

Implementations of the present disclosure may provide photovoltaic devices with a solid electrode and silicon particle absorber that is flexible (i.e., to be repeatedly flexed or operated in a flexed position without degrading the conversion efficiency of light to electricity).

According to some implementations of the disclosure, the surface area to volume ratio of the small silicon particles used herein is very high compared to silicon wafers. Increasing this ratio emphasizes the impact of recombination at the surface vs. recombination in the bulk of the absorber, as shown by solar cells fabricated on very thin wafers.

According to another implementation, deposition of a semiconductor on the surface of the silicon particles before the particles are deposited on a substrate is performed in order to form a p-n junction or electron-selective or hole-selective layer for extraction of one type of electronic carrier and blocking of the other. Deposition of a semiconductor layer, in contrast, for example, with in-diffusion of dopants, result in higher efficiencies for some implementations. Deposition of this layer before the particles are deposited on a substrate allows an expanded range of processing techniques, including cleaning or otherwise preparing the particle surface before deposition and removing temperature limitations related to the substrate (e.g., formation of a Si—Al eutectic at 577° C.).

In some implementations, a semiconductor with thickness less than 50 nanometers is deposited in order to form a p-n junction or electron-selective or hole-selective layer for extraction of one type of electronic carrier and blocking of the other. This layer could be deposited on particles before the particles are deposited onto a substrate or afterward. The thin layers described herein can be deposited faster than conventional techniques, enabling the use of techniques like atomic layer deposition that create more uniform and conformal coverage. Thinner layers can also better optimize high carrier selectivity and low contact resistance.

According to another implementation, an interlayer is inserted between the silicon particle and the electrode in order to form an ohmic contact between the silicon particle and the electrode (e.g., a metal electrode). The interlayer can include, for example, LiF or MgF and, for example, can be inserted between n-type Si and an aluminum (Al) electrode. In this implementation, the insertion of the interlayer can avoid Fermi-level pinning at the Si-Al interface. The insertion of the interlayer can also reduce electronic carrier recombination at the contact by preventing the transport of one carrier type (either electrons or holes) to the contact. The interlayer can be formed in architectures in which the substrate is used as an electrode or an electrode is deposited on the substrate before the silicon particles are deposited on the substrate. The interlayer can also be formed in architectures in which the substrate is either transparent or removed before the device is finished and an electrode is deposited on top of the particles.

The interlayers can be deposited on the silicon particles before the silicon particles are deposited onto the substrate, or the interlayers could be deposited onto the substrate or electrode before the silicon particles are deposited. If the silicon particles are deposited on a different substrate and then an electrode is deposited or placed over them, the interlayer could be deposited onto the silicon particles before the electrode. Additionally, other combinations of these approaches could also be used. In contrast with direct contact designs, the use of the interlayer, for example, one or more interlayers provided in a laminated structure, between the silicon particles and the electrode can reduce contact resistance and recombination at contacts.

Moreover, the use of an interlayer prevents the transport of majority carriers to the contact (i.e., the interlayer prevents holes from reaching the contact if the silicon particles have p-type conductivity and electrons if the silicon particles have n-type conductivity). Using implementations of the present disclosure, minority carriers can be extracted at the electrode, thereby enabling independent optimization of each contact for carrier selectivity, contact resistance, optical properties, and processing compatibility with other layers as well as more flexibility in the conductivity type of the silicon particle.

In another implementation, the device structure utilizes an aluminum or an aluminum-containing paste as one of the electrodes (and optionally also the substrate) and a heat treatment process is performed after the silicon particles are brought into contact with the aluminum. The heat treatment process can create a region in the silicon particle with a concentration of Al (which acts as a p-type dopant in Si) greater than the background doping concentration in the silicon particle. Through the creation of a high-low junction or Back Surface Field ("BSF") as well as differential mobility for electrons and holes, this region prevents transport of electrons to the Al electrode, while allowing transport of holes creating a contact with low contact resistance and low carrier recombination. This heat treatment and doping can be used either on a bare p-type particle or on a p-type particle with a region near the surface where an n-type dopant has been diffused into the particle. In the latter case, the Al dopant concentration can exceed the concentration of the n-type dopant in the B SF region. Accordingly, some implementations enable reductions in contact resistance and carrier recombination.

In another implementation, one or more layers are deposited as elements of the photovoltaic device structure to provide an anti-reflection (AR) coating functionality. For implementations in which silicon particles are deposited on a substrate and a p-n junction (or carrier-selective contacts) are formed (either before or after deposition on the substrate), deposition of one or more layers on top of the device structure with a refractive index and thickness selected to reduce or minimize reflection from the device structure can be used to form an AR coating. In implementations in which a transparent conductor is deposited over the top of the substrate/particles/junction structure, the refractive index and thickness of this transparent conductor could be selected, so that the transparent conductor also acts as an AR coating. By using another layer within a stack of materials with a different refractive indices, the thickness of this layer can be tuned such that thin-film interference reduces or minimizes reflection from the device.

FIGS. 1A-1I illustrate a method of forming a photovoltaic device using silicon particles according to some implementations of the present disclosure. In FIG. 1A, silicon particles 110 are acquired. The particle size could be 20-100 micrometers. Smaller sizes (down to 1 micrometer) are also possible but may utilize additional light-trapping structures (e.g., waveguide structures or nano-patterning) to provide a desired efficiency. Although the silicon particles 110 are illustrated as spherical, the silicon particles 110 can be other shapes and are represented as spheres merely for purposes of clarity. The silicon particles 110 may be doped n-type (with a group V element like phosphorus, etc.) or p-type (with a group III element like boron, gallium, etc.). Resistivity of this layer could be between 1 and 150 ohm-cm (e.g., between 1 and 25 ohm-cm). In some implementations, the doping concentration of boron ranges between 1e14 $cm^{-3}$ and 1.5e16 $cm^{-3}$. In some implementations, the doping concentration of phosphorus ranges between 3e13 $cm^{-3}$ and 5e15 $cm^{-3}$. The silicon particles 110 could be monocrystalline such that no grain boundaries exist within them or the particles could have crystalline domains of a similar order of magnitude to the size of the particles such that few grain boundaries exist within them. The silicon particles 110 could be produced through metallurgical refining of silicon or silicon oxide to a purity greater than 99.99% (more likely 99.9999-99.9999999%). The silicon particles 110 could also be produced through crystallization of a silicon-containing gas like silane or trichlorosilane. This process can include the Siemens process, a fluidized bed reactor process, a CVD process (as in epitaxial growth), combinations thereof, or the like. The crystal grains could be enlarged by, e.g., applying a heat treatment to the particles (or to a piece of solid silicon that is later crushed to form particles). This heat treatment could also reduce the presence of other crystal defects (e.g., dislocations) and impurities (e.g., transition metals including Fe, Cu, Ni, Co, and Cr). If impurities are going to be removed during the heat treatment, it may be necessary to have sinks for these impurities on the surface that may then be etched off. These could include, e.g., a phosphorus-rich layer, an oxygen-rich layer, or oxygen precipitates. The silicon particles 110 could also be produced as kerf when sawing silicon (e.g., wire sawing a silicon ingot into wafers). The silicon particles 110 could also be produced by crushing larger pieces of silicon (either monocrystalline silicon or polysilicon with crystal grains significantly larger than 100 μm) into a powder. These silicon particles 110 could also be produced by crystallization from a liquid silicon source like cyclohexasilane or molten elemental silicon. The silicon particles 110 could also be produced by anodic etching of larger pieces of silicon to create a porous layer and mechanical removal of this porous layer. Silicon particles 110 could also be produced by crushing a larger block or blocks of solid silicon using a ball mill. In some implementations where the silicon particles 110 are grown from the gas phase, the particles could be grown such that there is an inner core that is lightly doped and an outer shell that is doped more heavily and with opposite conductivity. This could be accomplished by changing the composition of the gases during crystallization. In some implementations, silicon particles 110 could be grown as a thin wafer (10-100 microns thick) with crystal grain sizes similar or larger than the wafer thickness. In other implementations, the silicon particles 110 could be grown as a thin film (similar thickness and crystal grain size to wafer) on a non-silicon substrate (e.g. glass or quartz). In some implementations, this silicon wafer or film could be mounted onto a flexible substrate (e.g., stainless steel or aluminum sheet/foil) and run between rollers to crush the wafer or film, obtaining particles of appropriate size and shape. These rollers could be flat or have teeth. In some implementations, this crushing process could take place on a bare wafer/film or a silicon wafer/film that has had additional processing done (e.g., dopant diffusion, deposition of dielectric passivating or carrier-selective layers, deposition of metals). In the case that crushing takes place after additional processing on the wafer/film, the crushing process could be done in such a way that the crushed pieces remain oriented relative to the carrier. In some implementations, the method can include etching of the surface of the silicon particles in order to create surface texture that minimizes reflection. This etching could be wet etching with either acidic (combination of hydrofluoric and nitric acid, and in some implementations with additional buffering agents like water or acetic acid) or alkaline (e.g., KOH or NaOH) etching solution that produces surface texture on the order of 1-5 microns (3-5 microns for example) with texture feature aspect ratios close to one in some implementations. It could also be a reactive ion etch (e.g., $SF_6/O_2$ process gases), laser ablation process (with or without process gases present), metal-catalyzed wet chemical etch, or plasma immersion ion implantation process that produces surface texture on the order of tens to hundreds of nanometers with texture feature aspect ratios of 2-10. The etching process can be performed prior to embedding of the silicon particles 110, as well as after embedding, for example, after the particles are partially exposed after the step illustrated in FIG. 1E and at other appropriate steps in the process when the bare particle is partially or fully exposed.

In FIG. 1B, a dopant is diffused to create a junction (i.e., layer 112). In some implementations, layer 112 is a highly conductive doped silicon layer near the surface of particle 10 with opposite doping/conductivity to the particle 10. The thickness of layer 112 could be 10 nm to 10 μm thick (e.g., 100 nm to 1 μm). The peak doping of layer 112 could be 1e17 to 1e20 $cm^{-3}$ (1e18 to 2e19 $cm^{-3}$ for example). The dopant source for layer 112 could be either a gas source (e.g., $POCl_3$ for phosphorus or $BBr_3$ for boron), a liquid source, or a plasma source. This dopant source could be deposited on the surface of the particles 10 by CVD in a tube furnace at or below atmospheric pressure, by plasma-enhanced CVD, by immersing the particles in a liquid, or by coating a liquid onto the particles. These sources typically create a silicate glass on the surface of the silicon particles 110, which could either be removed by hydrofluoric acid (either in aqueous solution or in vapor form) or left in place to act as a passivating layer on the surface of the silicon particles 110. During the in-diffusion process, metals and other impurities can be gettered to layer 112 to minimize their impact on device performance. After this process, the near surface region or the entire heavily-doped region could be removed (e.g., by chemical etching in acidic or alkaline solution). If layer 112 is thick (greater than 1 μm), the near-surface region could be removed to make the dopant profile more uniform and less heavily doped to reduce recombination in this layer while still providing carrier selectivity.

In FIG. 1C, a passivating dielectric layer 114 is deposited onto the surface of the silicon particles 110. Passivating dielectric layer 114 could be an oxide (e.g., stoichiometric or non-stoichiometric silicon oxide or a metal oxide like aluminum oxide or titanium oxide), a nitride (like silicon nitride), a fluoride like LiF or MgF, amorphous silicon, or an organic compound like PEDOT-pss. In some implementations the passivating dielectric layer 114 may include multiple layers (e.g., intrinsic, doped a-Si, $SiO_2$, and doped polycrystalline silicon). In some implementations, any of these layers could be processed (either during deposition or afterward) to contain excess hydrogen in order to tie up unsatisfied valence electrons at the silicon surface. These materials could be deposited by atomic layer deposition (at or below atmospheric pressure), by CVD (at or below atmospheric pressure), by plasma-enhanced CVD, or by immersion or coating from a liquid source. The thickness of this layer could be 1-100 nanometers (e.g., 10-20 nanometers). In some implementations, passivating dielectric layer 114 is designed to have a large amount of "fixed charge" to provide field effect as well as chemical passivation of the silicon surface by creating a depletion, accumulation, or inversion layer (depending on the conductivity type of the particle and layer 112, and the polarity of the fixed charge in passivating dielectric layer 114).

In some implementations, a transparent conductor layer 115 is deposited onto the surface of the silicon particles 110. In some implementations, the transparent conductor layer 116 could be an oxide such as tin oxide or zinc oxide. The transparent conductor layer 115 could be doped or alloyed with another element to increase its conductivity (e.g., with indium in the case of tin oxide or with aluminum in the case of zinc oxide). The transparent conductor layer 115 could be a low-dimensional carbon layer like graphene or a carbon nanotube mesh. The transparent conductor layer 115 could be a conductive polymer like PEDOT. It could be a diffuse metal mesh made of nanoparticles or nanowires (e.g., silver or copper). The transparent conductor layer 115 could be deposited by CVD (including using metal-organic precursors), laser or beam deposition, physical vapor deposition, spray pyrolysis, or immersion or coating from a liquid source. The thickness of the transparent conductor layer 115 could be 10-300 nm (e.g., 60-200 nm). Heavy doping of the transparent conductor layer 115 could provide additional field effect passivation of the surface of the silicon particle 110 and of layer 112.

In FIG. 1D, the silicon particles 110 are embedded on a carrier 116. In some implementations, the carrier 116 could be a polymer film like PET coated with a soft polymer that could be curable with application of heat or radiation. Either the entire film or the soft polymer coating could be dissolved easily in a solvent that does not react with any of the active layers of the solar cell. The film and/or the coating could be impervious to exposure to materials that dissolve the active layers, including alkaline solutions like potassium hydroxide or sodium hydroxide or acidic solutions like nitric acid, hydrofluoric acid, acetic acid, hydrochloric acid or combinations thereof. The embedding process could be done by packing, shaking, depositing, or any other method of placing the particles onto the surface of the substrate and then running the carrier between two rollers (the particles 10 could also be deposited at the pinch point of the rollers with the foil making a right-angle turn just before the pinch point), or the like. In some implementations, instead of using two rollers, blade coating the particles or powder coating (i.e., aerosolize particles and direct the particle-laden fluid at the substrate) can be used. The process could leave from 10% to 90% of the particles exposed (e.g., 80-90%).

In FIG. 1E, layer 112 and passivating dielectric layer 114 are partially removed. Layer 112 and passivating dielectric layer 114 could be removed mechanically (e.g., with abrasion by a fine grit material like silicon carbide or diamond either in a slurry solution or embedded on a film), optically (e.g., by laser ablation), chemically (e.g., by selective etching, including wet etching, dry etching, or reactive ion etching), or by ion bombardment. In some implementations where layer 112 and passivating dielectric layer 114 are removed chemically, the chemicals used could be selective such that the chemicals etch these layers much faster than the chemicals etch the underlying silicon particles 110.

In FIG. 1F, a passivating dielectric layer 118 is deposited. This process may be similar to the step illustrated in FIG. 1C. The passivating dielectric layer 118 would be optimized for the doping concentration and type of the silicon particle rather than the heavily doped region. The passivating dielectric layer 118 would coat not only the silicon particles 110 but the spaces between the silicon particles 110 on the carrier 116 as well. In some implementations, an insulating layer (not shown) is optionally deposited. In some implementations, this insulating layer could be similar to passivating dielectric layer 114 or passivating dielectric layer 118, and in others this insulating layer could be a polymer or a rubber. In some implementations where this insulating layer is identical to passivating dielectric layer 118, then this insulating layer could be deposited in a manner similar to the one shown in FIG. 1G. In some implementations where this insulating layer is deposited by coating, the coating process could result in greater thickness between the silicon particles 110 than on top of the silicon particles 110 (e.g., 1-100 microns between the silicon particles 110 and 10 nm to 1 micron on top of the silicon particles 110). In some implementations, this insulating layer could be impervious to one or more of the solvents that dissolve the carrier 116 or a coating of the carrier 116 but do not react with the active layers. In some implementations, this insulating layer could completely cover the silicon particles 110. In one implementation, this insulating layer could be negative photoresist deposited by a coating process such that the thickness between the silicon particles 110 is greater than the thickness on top of the silicon particles 110 (e.g., 1 micron between and 10 nm on top). The polymer does not need to be designed or used for photolithography as long as a negative resist is made in soluble in solvent/etching/solution/developer by light exposure and positive resist is made insoluble. The photoresist could then be exposed to light such that the thickness of resist exposed corresponds to the thickness on top of the silicon particle 110 and some of the resist between the silicon particles 110 remained unexposed. In another implementation, this insulating layer could be a positive photoresist illuminated either from both sides or from the substrate side (with a wavelength of light that has high transmission through the substrate but low transmission through the silicon particle 110) such that areas between the silicon particles 110 receive a higher photon dose than areas above the silicon particle 110.

In FIG. 1F, a portion of passivating dielectric layer 118 is removed to expose the surface of the silicon particles 110. The amount (e.g., surface area) of the silicon particle 110 exposed after this removal could be 5%-20%. If a photoresist is used as in FIG. 1F, this process could be a solvent wash designed for photoresist removal. This process could result in pinholes rather than complete removal of the passivating dielectric layer 118 above the silicon particle 110. If this was an optical process, the process could use interaction between two photons of a wavelength reflected more efficiently by the silicon particle 110 than the underlying substrate such that absorption by two photons (a primary incident and a reflected photon) is more likely above the particle than between silicon particles 110.

In FIG. 1G, a metal layer 120 is deposited. This could be a single metal (e.g., Al, Ag, or Cu) or a metal stack (e.g., Ti/Ni/Ag or Ti/Pd/Ag) or an alloy. The metal layer 120 could be contained in a paste or solution and printed onto the surface of the silicon particle 110. In some implementations, the paste/solution could be an alloy (e.g., Ga, In, and Ti or Ga, In, and Sn) that is liquid at or near room temperature. In some implementations, the metal layer 120 could be deposited by a PVD process (e.g., evaporation or sputtering). In some implementations, this metal layer 120 could be a free-standing foil or sheet. This sheet could be flexible. With some of these processes, a high-temperature curing step could be used to create a "back-surface field," achieve better adhesion or interface properties, improve the bulk metal properties (e.g., sinter nanoparticles). Heating of this type could also be achieved locally (e.g., by using a laser). Photonic curing could also be used. Curing could also remove non-metallic (e.g., organic) elements from a paste or ink. In some implementations where an alloy is used, some of the elements in this alloy could be dopants in Si (e.g., Ga or Al) and in-diffuse into the silicon particles 110. In some implementations where an alloy is used, the alloy could be designed such that the electron transport layer (or hole transport layer) or components of the electron transport layer (or hole transport layer) are soluble in the alloy or form a eutectic with the alloy such that during the curing step, the electron transport layer (or hole transport layer) dissolves where it is in contact with the metal alloy. In some implementations, an interlayer like LiF, MgF, $MoO_x$, or $NiO_x$ could be deposited between the silicon particle 110 and the metal layer 120 to reduce the contact resistance between the silicon particle 110 and the metal layer 120. The thickness of this interlayer could be 0.5-15 nm (e.g., 1-1.5 nanometers).

In FIG. 1G, the carrier 116 is removed. In some implementations, the carrier 116 is dissolved to effectuate the removal process. The carrier 116 could be dissolved in a solvent that does not react with the active layers of the solar cell. In FIG. 1H, a portion of layer 114 is removed, completely or in part, to expose the doped surface of the silicon particle 110.

In FIG. 1I, a transparent conductor layer 122 is deposited on the side of the silicon particle 110 where the carrier 116 was previously. In some implementations, the transparent conductor layer 122 could be a material similar to transparent conductor layer 115. In some implementations, the transparent conductor layer 122 could be deposited in a similar manner to transparent conductor layer 115. In some implementations, the transparent conductor layer 122 could be a diffuse conductor like silver nanowires. In some implementations, the transparent conductor layer 122 could be a combination of these conductors. In some implementations, the transparent conductor layer 122 could be deposited through a coating process like spin-coating, blade-coating, or slot-die coating or a non-coating process suitable for depositing diffuse conductors. According to some implementations, the transparent conductor layer 122 could be deposited onto the particles now embedded into a metal substrate. In some implementations, the transparent conductor layer 122 could instead or in addition, be deposited onto a laminate film that is subsequently laminated onto the substrate and particles. In FIG. 1I, the cell is laminated (i.e., layer 124). The substrate could be laminated with a barrier film like EVA or the like. The laminate could be attached to the substrate or it could surround the substrate. The laminate could have conductive wires embedded into it to enable efficient carrier extraction from the silicon particles 110 through the transparent conductor layer 122.

Figure 2:
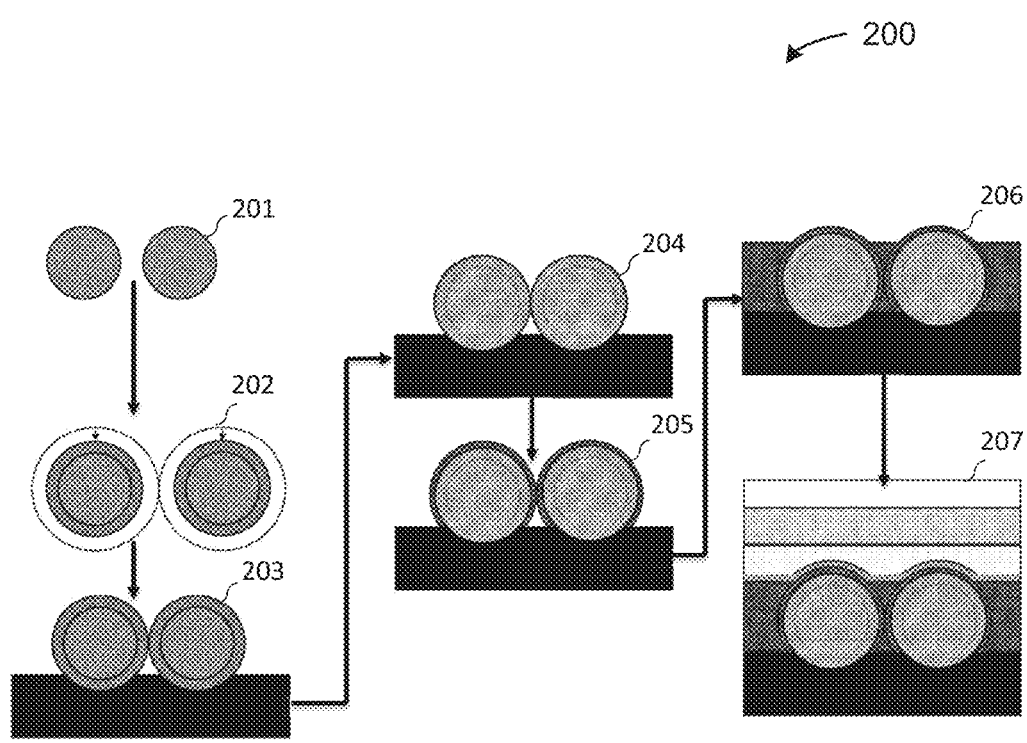
FIG. 2 is a flow chart diagram illustrating a method for fabricating a photovoltaic device using silicon particles, in accordance with some implementations of the present disclosure.

FIG. 2 is a flow chart diagram illustrating a method 200 of forming a photovoltaic device using silicon particles according to some implementations of the present disclosure. In Step 201, silicon particles are acquired. These particles could have similar properties to those described in relation to FIG. 1. In some implementations, the particles could be doped p-type (with a group III element like boron, gallium, etc.).

In Step 202, a dopant species is diffused into the particle (Layer 1). This is similar to Step 102 in FIG. 1. In some implementations, an n-type dopant (e.g., a group V element like phosphorus, etc.) could be used. In some implementations, this step could be omitted.

In Step 203, particles are embedded onto a metal foil. In some implementations, a hole transport layer is deposited on the particle before embedding on metal foil. In this case, particles could be either p-type or n-type (with electron transport layer deposited instead of a hole transport layer). In some implementations, the metal foil could be coated with a metal ink or paste containing the same metal or a different metal. In some implementations, the paste (and the foil) could be aluminum which also acts as a p-type dopant in silicon. In some implementations, this paste/solution could be an alloy (e.g., Ga, In, and Ti or Ga, In, and Sn) that is liquid at or near room temperature. The particles could be embedded on the metal foil by packing, shaking, depositing, or any other method of placing the particles onto the surface of the foil and then running the foil between two rollers (the particles could also be deposited at the pinch point of the rollers with the foil making a right-angle turn just before the pinch point) or the like.

In Step 204, the particles and metal are fired to in-diffuse Aluminum (Al). The firing could take place in a belt furnace or optical furnace with a drying step (below 400° C.) to dry the ink/paste, and a step between 400 and 1000° C. (e.g., in two to three phases with one phase between 500 and 600° C., another between 600 and 1000° C., and potentially a third between 500 and 600° C. again). The total duration of the second step could be between 10 seconds and 300 seconds (e.g., 50-100 seconds with the time spent above 600° C. limited to less than 10 seconds). In some implementations, the firing could instead be performed by application of a laser. The firing would both form an ohmic contact between the silicon particles and the metal paste/foil and in-diffuse Al. The in-diffusion of Al would lower the mobility of electrons relative to holes and form a high-low junction at the back of the cell, creating a hole-selective contact between the silicon particles and metal paste/foil. In order to accomplish this second goal, the concentration of Al would have to exceed the concentration of the n-type dopant in Layer 1. In some implementations where an alloy is used, some of the elements in this alloy could be dopants in Si (e.g., Ga or Al) and in-diffuse into silicon particles. In some implementations where an alloy is used, the alloy could be designed such that the electron transport layer (or hole transport layer) or components of the electron transport layer (or hole transport layer) are soluble in the alloy or form a eutectic with the alloy such that during the curing step, the electron transport layer (or hole transport layer) dissolves where it is in contact with the metal alloy.

In Step 205, a passivating dielectric (Layer 2) is deposited on the exposed surface of the particles. This material is similar to Layer 2 in FIG. 1. Deposition techniques are also similar to Layer 2 in FIG. 1.

In Step 206, an insulating layer (Layer 3) is deposited. This layer is similar to Layer 5 in FIG. 1. In some implementations, this step could be combined with Step 205 if the insulating layer also provides good surface passivation. In step 206, some of Layer 2 and some of Layer 3 is removed to reveal the particle. This step is similar to Step 106 in FIG. 1. Layer 2 does not need to be removed if it is not a barrier to electron transport (e.g., ultrathin $SiO_2$ that can be tunneled through). This is shown in FIG. 2. Layer 3 does not need to be removed if it can be deposited so that it does not cover part of the particle.

In Step 207, an electron transport layer (Layer 4) is deposited. Layer 4 could have excellent band alignment between its conduction band and the conduction band of the silicon particle. This alignment could be optimized when the conduction band of Layer 4 is slightly (about 10-30 meV) higher than the conduction band of the silicon particle. This layer could have a wider bandgap than the silicon particle to provide an energetic barrier to hole transport. In some implementations, this layer could have a higher electron conductivity than hole conductivity. In some implementations, this layer could be a metal oxide like $TiO_2$ or n-doped a-Si. This layer could be a stack of materials with a highly resistive or insulating material like undoped intrinsic a-Si or $SiO_2$ under a more conductive material like those listed above. This layer could be deposited by atomic layer deposition (at or below atmospheric pressure), chemical vapor deposition (at or below atmospheric pressure), physical vapor deposition, spray pyrolysis, sol-gel, or coating from a liquid source. This layer could be 0.5-20 nm thick (e.g., 1-3 nm).

In Step 207, a transparent conductor (Layer 5) is also deposited. This step is similar to Step 109 in FIG. 1. In Step 207, the cell is also laminated. This step is similar to Step 109 in FIG. 1.

Figure 3:
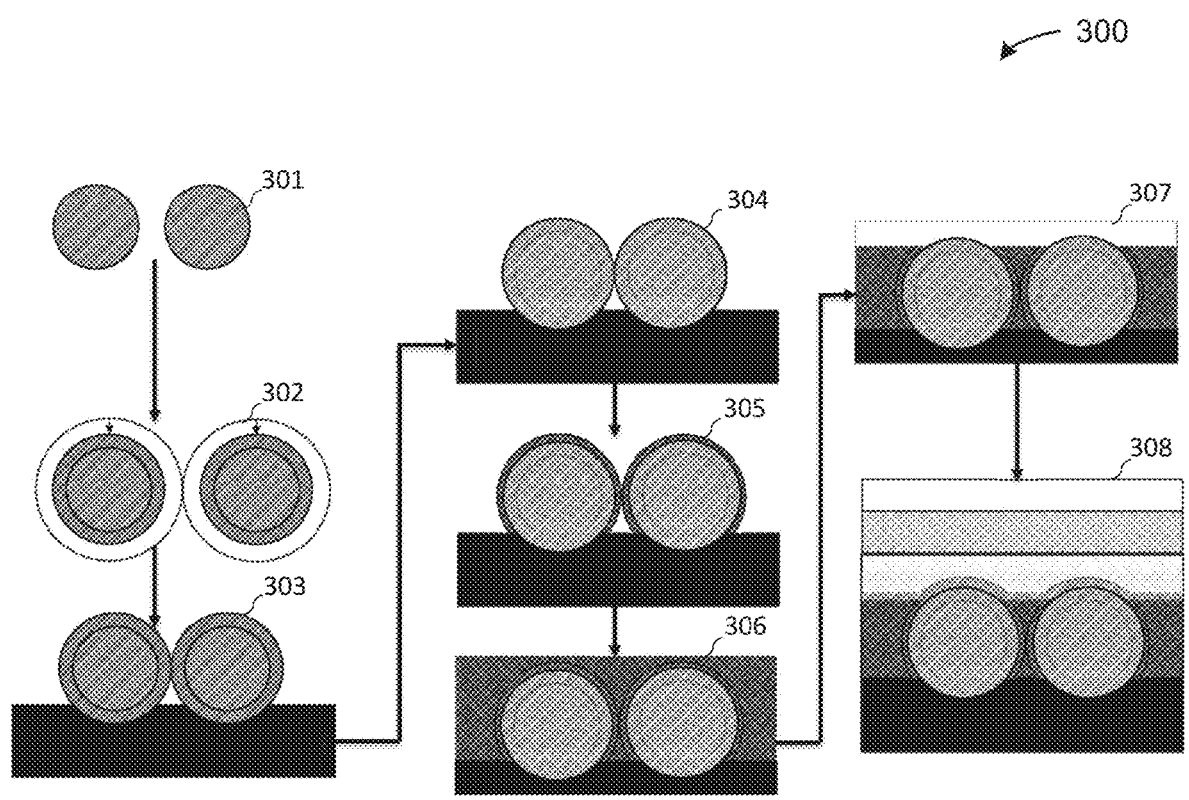
FIG. 3 is a flow chart diagram illustrating a method for fabricating a photovoltaic device using silicon particles, in accordance with some implementations of the present disclosure.

FIG. 3 is a flow chart diagram illustrating a method 300 of forming a photovoltaic device using silicon particles according to some implementations of the present disclosure. In Step 301, silicon particles are acquired. This step may be similar to Step 201 in FIG. 2. In Step 302, a dopant species is diffused into the particle (Layer 1). This step may be similar to Step 202 in FIG. 2. In some implementations, this step may be omitted. In Step 303, particles are embedded onto a metal foil. This step may be similar to Step 203 in FIG. 2. In Step 304, the particles and metal are fired to in-diffuse Al. This step may be similar to Step 204 in FIG. 2. In Step 305, a passivating dielectric (Layer 2) is deposited on the exposed surface of the particles. This step may be similar to Step 205 in FIG. 2. In Step 306, an insulating layer (Layer 3) is deposited. This step may be similar to Step 206 in FIG. 2. In Step 307, Layer 2 and Layer 3 are partially removed to reveal the surface of the particle. The removal of Layers 2 and 3 may be performed in a similar manner as Step 106 in FIG. 1. In Step 308, a selective carrier transport layer (Layer 4) is deposited. This step may be similar to Step 207 in FIG. 2. In Step 308 a transparent conductor (Layer 5) is deposited. This step may be similar to Step 207 in FIG. 2. In Step 308, the cell is laminated. This step may be similar to Step 207 in FIG. 2.

Figure 4:
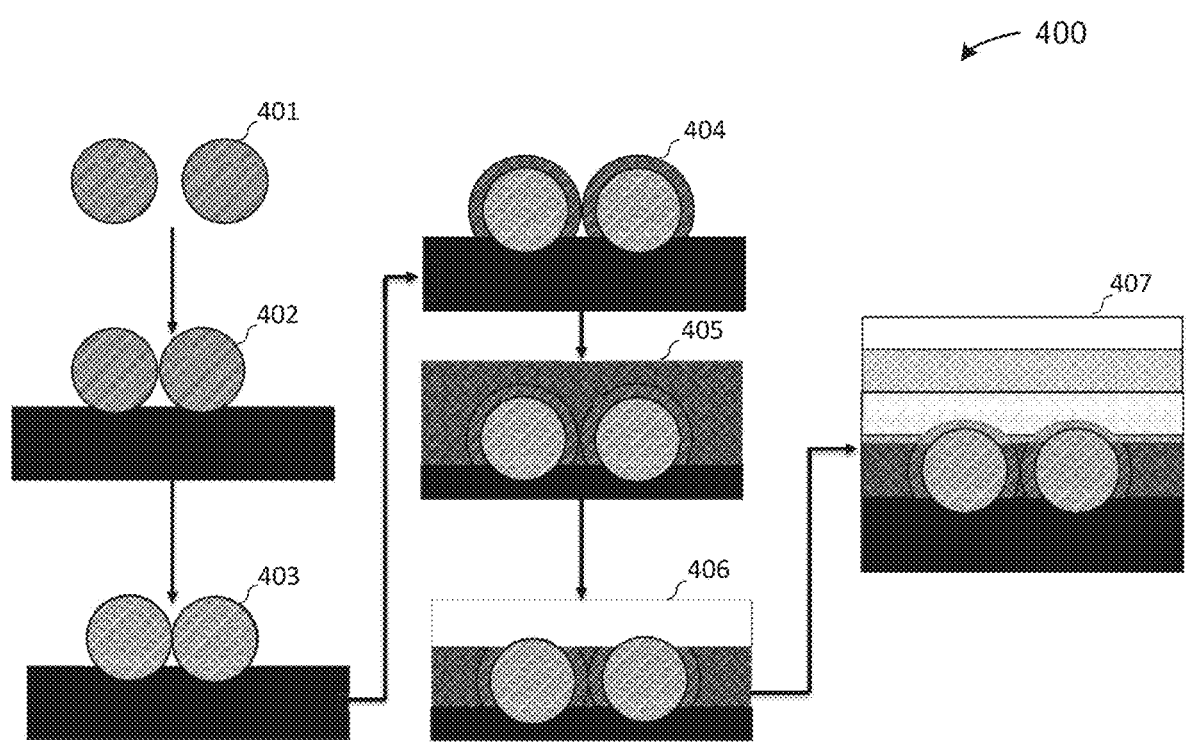
FIG. 4 is a flow chart diagram illustrating a method for fabricating a photovoltaic device using silicon particles, in accordance with some implementations of the present disclosure.

FIG. 4 is a flow chart diagram illustrating a method 400 of forming a photovoltaic device using silicon particles according to some implementations of the present disclosure. In Step 401, silicon particles are acquired. This step may be similar to Step 201 in FIG. 2. In Step 402, particles are embedded onto a metal foil. This step may be similar to Step 203 in FIG. 2. In Step 403, the particles and metal are fired to in-diffuse Al. This step may be similar to Step 204 in FIG. 2. In Step 404, a passivating dielectric (Layer 1) is deposited on the exposed surface of the particles. This step may be similar to Step 205 in FIG. 2. In Step 405, an insulating layer (Layer 2) is deposited. This step may be similar to Step 206 in FIG. 2. In Step 406, Layer 1 and Layer 2 are partially removed to reveal the surface of the particle. The removal of Layers 1 and 2 may be performed in a similar manner as Step 106 in FIG. 1. In Step 407, a selective carrier transport layer (Layer 3) is deposited. This step may be similar to Step 207 in FIG. 2. In Step 407, a transparent conductor (Layer 4) is deposited. This step may be similar to Step 207 in FIG. 2. In Step 407, the cell is laminated. This step may be similar to Step 207 in FIG. 2.

Figure 5:
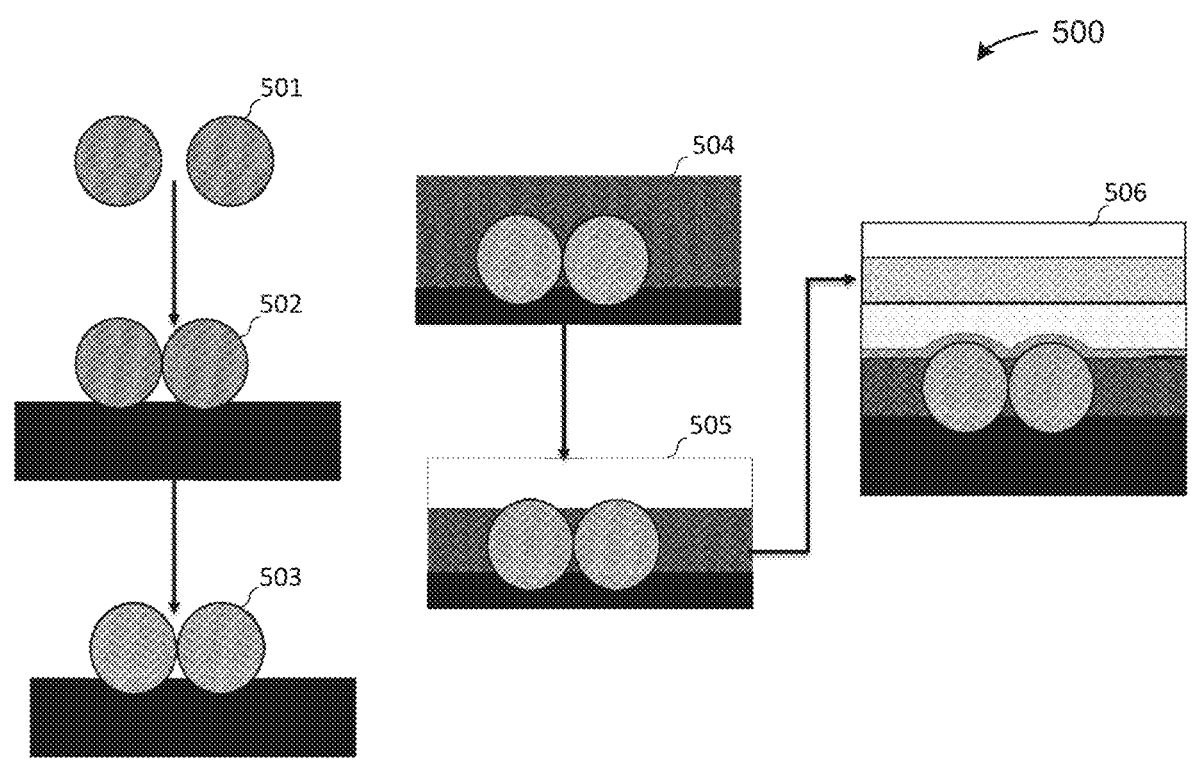
FIG. 5 is a flow chart diagram illustrating a method for fabricating a photovoltaic device using silicon particles, in accordance with some implementations of the present disclosure.

FIG. 5 is a flow chart diagram illustrating a method 500 of forming a photovoltaic device using silicon particles according to some implementations of the present disclosure. In Step 501, silicon particles are acquired. This step may be similar to Step 201 in FIG. 2. In Step 502, particles are embedded onto a metal foil. This step may be similar to Step 203 in FIG. 2. In Step 503, the particles and metal are fired to in-diffuse Al. This step may similar to Step 204 in FIG. 2. In Step 504, a passivating dielectric (Layer 1) is deposited. In this implementation, the passivating dielectric also provides insulating properties allowing an insulating layer to be optional (Insulating layer is foregone in FIG. 5.). This process of deposition in this step may be similar to that of Step 106 in FIG. 1. In Step 505, Layer 1 is partially removed to reveal the surface of the particle. The removal of Layer 1 may be performed in a similar manner as Step 106 in FIG. 1. In Step 506, a selective carrier transport layer (Layer 2) is deposited. This step may be similar to Step 207 in FIG. 2. In Step 506, a transparent conductor (Layer 3) is deposited. This step may be similar to Step 207 in FIG. 2. In Step 506, the cell is laminated. This step may be similar to Step 207 in FIG. 2.

Figure 6:
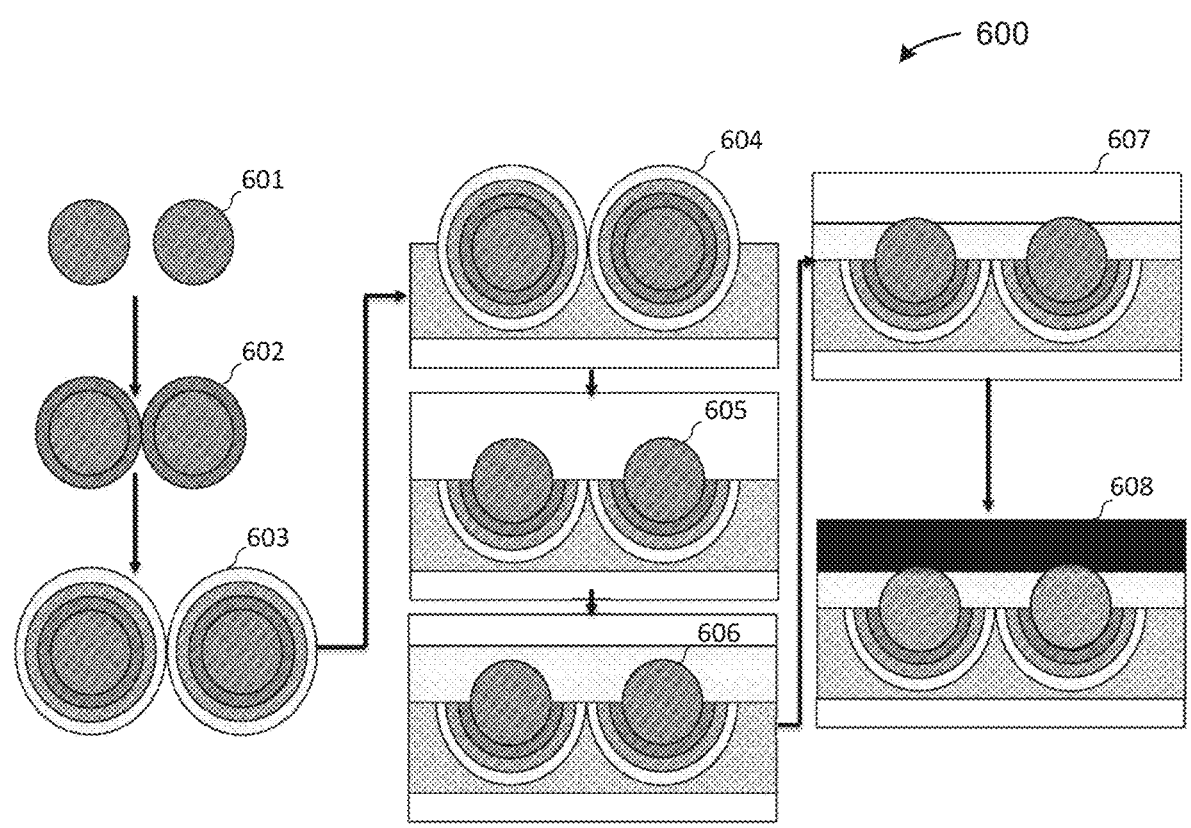
FIG. 6 is a flow chart diagram illustrating a method for fabricating a photovoltaic device using silicon particles, in accordance with some implementations of the present disclosure.

FIG. 6 is a flow chart diagram illustrating a method 600 of forming a photovoltaic device using silicon particles according to some implementations of the present disclosure. In Step 601, silicon particles are acquired. This step may similar to Step 101 in FIG. 1. In Step 602, a dopant is diffused to create a junction (Layer 1). This step may be similar to Step 102 in FIG. 1. In Step 603, a selective carrier transport layer (Layer 2) is deposited. Layer 2 may be similar to Layer 4 in FIG. 2. Layer 2 may be deposited similarly to Layer 4 in FIG. 2. Because it is being deposited on particles, Layer 2 could also be deposited by an ALD or CVD-type process in a fluidized bed reactor. In some implementations, this layer may be deposited on top of an ultrathin (e.g., less than 1.5 nm) insulator like $SiO_2$ that provides excellent surface passivation and has a thin enough electronic barrier to carrier transport to allow efficient transport by quantum tunneling or through pinholes. In some implementations, this layer could instead be deposited on top of an undoped intrinsic semiconductor like a-Si for the same reason. This layer could be thin enough (e.g., less than 10 nm) that electronic carrier transport occurs through a combination of tunneling, hopping, and electronic drift. In Step 603, a transparent conductor (Layer 3) is deposited. This step may be similar to Step 103 in FIG. 1. In Step 604, particles are embedded into a substrate. In some implementations, the substrate could be a polymer film like PET or silicone coated with a soft polymer that could be curable with application of heat or radiation. In some implementations, the substrate and the coating could be flexible. In some implementations, the substrate and the coating could be highly transparent to solar radiation. In some implementations, the film and/or the coating could be impervious to exposure to materials that dissolve the active layers, including alkaline solutions like potassium hydroxide or sodium hydroxide or acidic solutions like nitric acid, hydrofluoric acid, acetic acid, hydrochloric acid or combinations thereof. The embedding process could be performed as described in other implementations herein. The process could leave from 10% to 90% of the particles exposed (e.g., 40-60%). In Step 605, part of Layers 1, 2 and 3 are removed to reveal the particles. This process may be similar to Step 105 in FIG. 1. In Step 606, a passivating dielectric (Layer 4) is deposited. This process may be similar to Step 205 in FIG. 2. In Step 606, an insulating layer (Layer 5) is deposited. This process is similar to Step 206 in FIG. 2. In Step 607, some of Layer 4 and some of Layer 5 are removed to reveal some of the particle. This process may be similar to Step 307 in FIG. 3.

In Step 608, a metal layer (Layer 6) is deposited and then fired. This process may be similar to Step 107 in FIG. 1.

Figure 7:
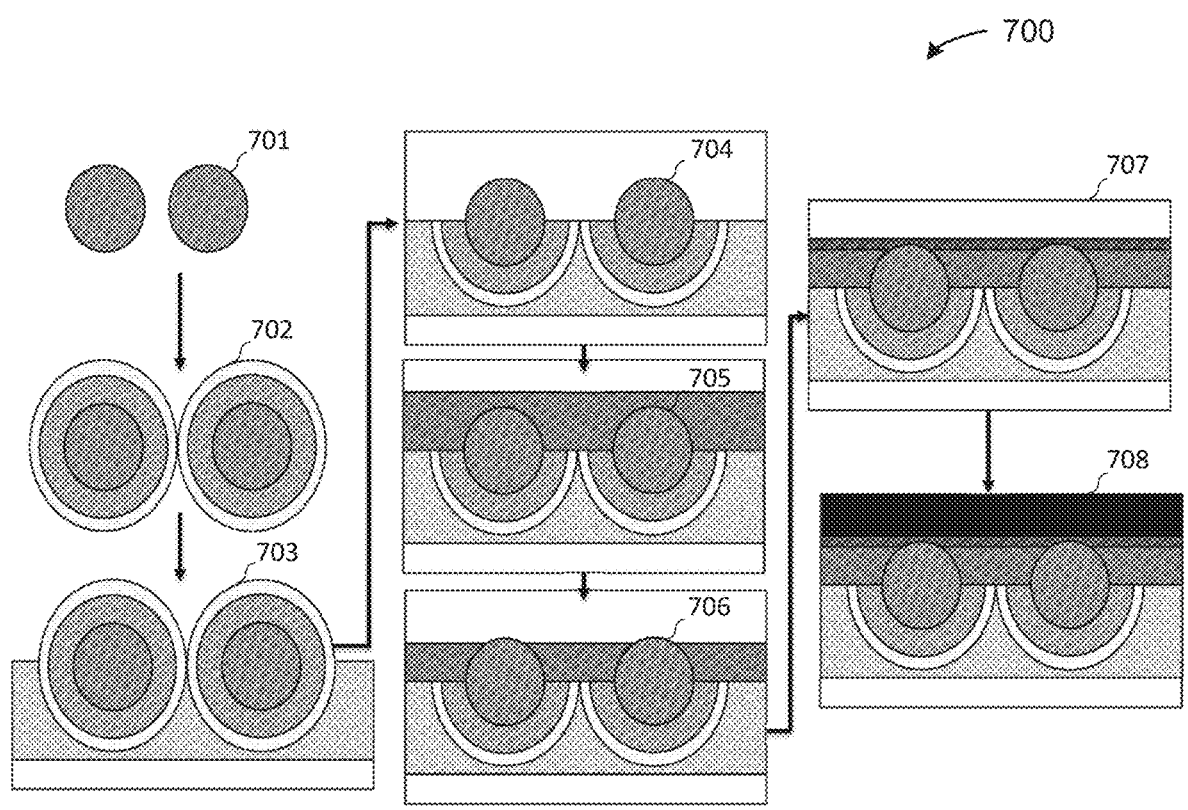
FIG. 7 is a flow chart diagram illustrating a method for fabricating a photovoltaic device using silicon particles, in accordance with some implementations of the present disclosure.

FIG. 7 is a flow chart diagram illustrating a method 700 of forming a photovoltaic device using silicon particles according to some implementations of the present disclosure. In Step 701, silicon particles are acquired. This step may be similar to Step 101 in FIG. 1. In Step 702, an electron transport layer or a hole transport layer (Layer 1) is deposited. This process may be similar to Step 603 in FIG. 6. If Layer 1 is a hole transport layer rather than an electron transport layer, Layer 1 could be a metal oxide like $MoO_x$ or multiple layers like intrinsic and doped amorphous silicon or $SiO_2$ and doped polysilicon. In Step 702, a transparent conductor (Layer 2) is deposited. This process may be similar to Step 103 in FIG. 1. In Step 703, particles are embedded onto a substrate. This process can be similar to Step 604 in FIG. 6. In some implementations, this process can vary from other embedding processes because the particles are embedded in a transparent substrate that is part of the finished cell/module. In Step 704, part of Layer 1 and part of Layer 2 is removed to reveal the particles. This process is similar to Step 106 in FIG. 1. In Step 705, a passivating dielectric (Layer 3) is deposited. This process is similar to Step 205 in FIG. 2. In Step 705, an insulating layer (Layer 4) is deposited. This process may be similar to Step 206 in FIG. 2. In Step 706, some of Layer 3 and some of Layer 4 is removed to reveal some of the particle. This process is similar to Step 207 in FIG. 2. In Step 707, a hole transport layer, electron transport layer, or tunnel interlayer (Layer 5) is deposited. If Layer 1 is conductive to electrons and blocks holes, Layer 5 is conductive to holes and blocks electrons and vice versa. In other respects, this process may be similar to Step 702. In some implementations, instead of being carrier selective/blocking, this layer could be an interlayer like LiF, MgF, $MoO_x$, or $NiO_x$ that reduces the contact resistance between the silicon particle and a metal. In Step 708, a metal layer (Layer 6) is deposited. This process may be similar to Step 608 in FIG. 6.

FIGS. 8A-8H illustrate a method of fabricating a photovoltaic device using counter-doping according to some implementations of the present disclosure. In FIG. 8A, silicon particles 810 are acquired. In FIG. 8A, a tunnel oxide layer 812 is deposited. The tunnel oxide layer 812 could provide excellent chemical surface passivation for the silicon particle 810. The tunnel oxide layer 812 could be one to four nanometers thick. In some implementations, the tunnel oxide layer 812 could be deposited by submersion of the particles in a heated nitric acid bath (T about 70° C.) or by surface treatment with ozone. In other implementations, other processes (e.g., CVD, ALD, etc.) can be utilized. In FIG. 8C, a degenerately doped silicon layer 814 is deposited. This layer could be deposited by chemical vapor deposition. Because it is being deposited on particles, this layer could be deposited in a fluidized bed reactor. The degenerately doped silicon layer 814 could be 5-200 nm thick (e.g., 50-100 nm). The degenerately doped silicon layer 814 could be annealed between 600° C. and 1000° C. (e.g., between 800 and 900° C.). The annealing process could in-diffuse dopants through the tunnel oxide layer 812 into the silicon particles 810 to help passivate the surface of the silicon particles 810. The annealing process could also change the crystal structure the degenerately doped silicon layer 814, e.g., forming crystal grains in a previously amorphous layer. The annealing process could also create pinholes in the tunnel oxide layer 812 to enable more efficient carrier transport/reduce contact resistance. In FIG. 8D, the silicon particles 810 are embedded on a metal foil layer 816. This process could leave 1-90% of the particle exposed (e.g., 10-20%). In FIG. 8E, the tunnel oxide layer 812 and the degenerately doped silicon layer 814 are partially removed exposing a portion of the silicon particle 810. The tunnel oxide layer 812 and the degenerately doped silicon layer 814 could be removed mechanically (e.g., with abrasion by a fine grit material like silicon carbide or diamond either in a slurry solution or embedded on a film), optically (e.g., by laser ablation), chemically (e.g. by selective etching, including wet etching, dry etching, or reactive ion etching), or by ion bombardment. If the tunnel oxide layer 812 and the degenerately doped silicon layer 814 are removed chemically, the chemicals used could be selective such that the chemicals etch the tunnel oxide layer 812 and the degenerately doped silicon layer 814 much faster than the chemicals etch the underlying silicon particles 810. A selective chemical process could proceed in two steps where one step is selective for silicon, removing the degenerately doped silicon layer 814 but not the tunnel oxide layer 812 and the other is selective for oxide (e.g., HF), removing the tunnel oxide layer 812 but not etching the underlying silicon particle. This process could also remove part of the degenerately doped silicon layer 814 but not the tunnel oxide layer 812. In FIG. 8F, a passivating dielectric layer 818 is deposited. In FIG. 8F, some of passivating dielectric layer 818 is removed to reveal part of the silicon particle 810. In some implementations, the passivating dielectric layer 818 is deposited before the tunnel oxide layer 812 and the degenerately doped silicon layer 814 are partially removed. In FIG. 8G, a dopant layer 820 is diffused into the silicon particle 810. This process could be a chemical vapor deposition (including with plasma enhancement), ion implantation, annealing after coating with a liquid dopant source. This dopant can be the opposite type from that in degenerately doped silicon layer 814. In some implementations, the dopant layer 820 could also be an interlayer of intrinsic undoped a-Si under heavily doped a-Si or an interlayer of heavily doped silicon on an interlayer of $SiO_2$. In the case of heavily-doped silicon on top of $SiO_2$, the $SiO_2$ layer could be the tunnel oxide layer 812 if the tunnel oxide layer 812 was not removed as described above. In FIG. 8G, a transparent conductor layer 822 is deposited. In FIG. 8H, the cell is laminated (i.e. layer 824).

FIGS. 9A-9H illustrate a method of fabricating a photovoltaic device using silicon particles according to some implementations of the present disclosure. In FIG. 9A, silicon particles 910 are acquired. In FIG. 9B, a tunnel oxide layer 912 is deposited. In FIG. 9C, a degenerately doped silicon layer 914 is deposited. In FIG. 9D, the silicon particles 910 are embedded on a metal foil layer 916. This process could leave 1-90% of the particle exposed (e.g., 10-20%). In FIG. 9E, the tunnel oxide layer 912 and the degenerately doped silicon layer 914 are partially removed exposing a portion of the silicon particle 910. In FIG. 9F, a passivating dielectric layer 918 is deposited. If the tunnel oxide layer 912 is not removed, the passivating dielectric layer 918 could be insulating but not passivating. In FIG. 9F, some of the passivating dielectric layer 918 is removed to reveal part of silicon particle. In FIG. 9G, an electron transport layer or a hole transport layer or a tunneling interlayer is deposited on the exposed silicon particle (i.e., layer 920). If the degenerately doped silicon layer 914 is doped n-type, layer 920 is conductive to holes and blocks electrons. If the degenerately doped silicon layer 914 is doped p-type, layer 920 is conductive to electrons and blocks holes. In some implementations, instead of being carrier selective/blocking, the layer 920 could be interlayer like LiF, MgF, $MoO_x$, or $NiO_x$ that reduces the contact resistance between the silicon particle 910 and a transparent conductor. In FIG. 9G, a transparent conductor layer 922 is deposited. In FIG. 9H, the cell is laminated (i.e., layer 924).

Figure 10G:
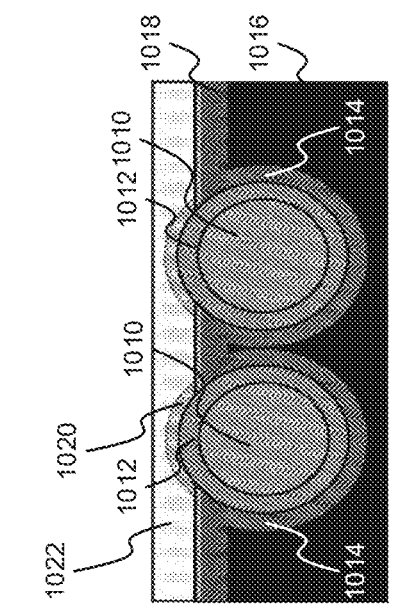
FIGS. 10A-10H are flow chart diagrams illustrating a method for fabricating a photovoltaic device using silicon particles, in accordance with some implementations of the present disclosure.
Figure 10H:
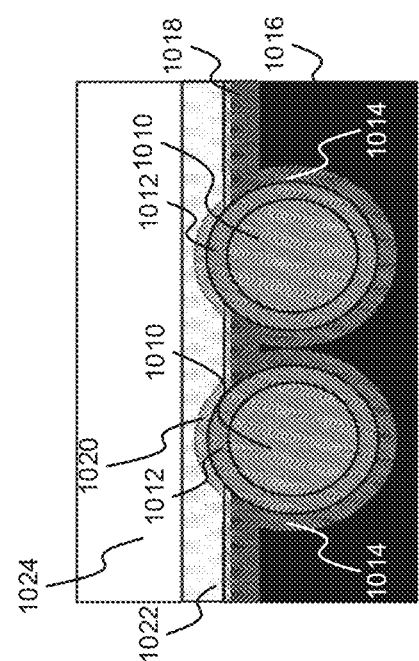
Figure 10D:
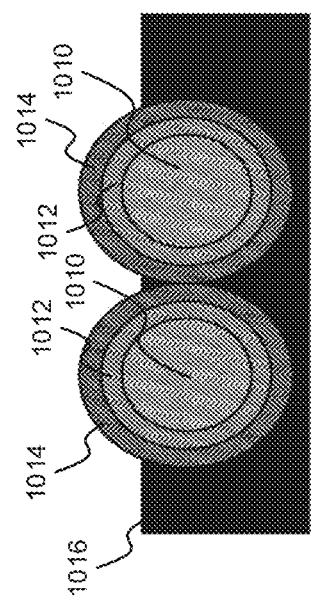
Figure 10E:
Figure 10F:
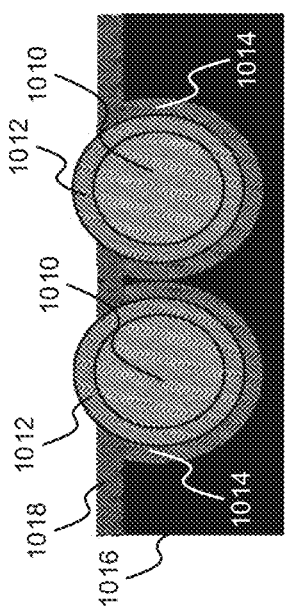
Figure 10A:
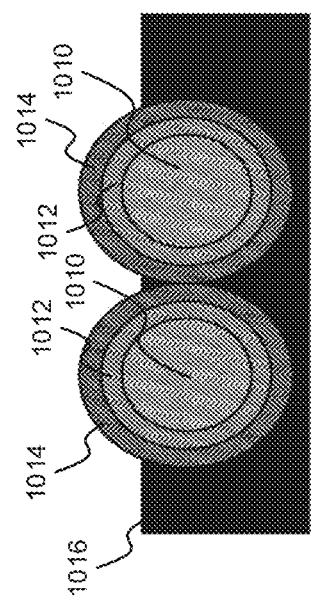
Figure 10B:
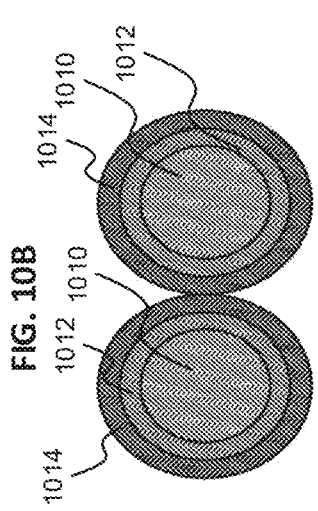
Figure 10C:
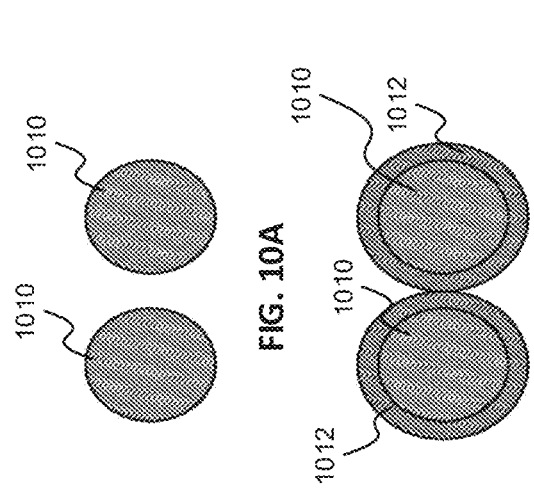

FIGS. 10A-10H illustrate a method of fabricating a photovoltaic device using silicon particles according to some implementations of the present disclosure. In FIG. 10A, silicon particles 1010 are acquired. In FIG. 10B, a tunnel oxide layer 1012 is deposited. In FIG. 10C, a degenerately doped silicon layer 1014 is deposited. In FIG. 10D, the silicon particles 1010 are embedded on a metal foil layer 1016. This process could leave 1-90% of the particle exposed (for example 10-20%). In FIG. 10E, a passivating dielectric layer 1018 is deposited and then a portion of the passivating dielectric layer 1018 is removed. In FIG. 10F, the degenerately doped silicon layer 1014 is partially removed exposing a portion of the silicon particle 1010. In FIG. 10G, an electron transport layer or a hole transport layer or a tunneling interlayer is deposited (i.e., layer 1020). If the degenerately doped silicon layer 1014 is doped n-type, layer 1020 is conductive to holes and blocks electrons. If the degenerately doped silicon layer 1014 is doped p-type, layer 1020 is conductive to electrons and blocks holes. In some implementations, instead of being carrier selective/blocking, layer 1020 could be interlayer like LiF, MgF, MoOx, or NiOx that reduces the contact resistance between the silicon particle and a transparent conductor. In FIG. 10G, a transparent conductor layer 1022 is also deposited. In FIG. 10H, the cell is laminated (i.e., layer 1024).

FIGS. 11A-11G illustrate a method of fabricating a photovoltaic device using silicon particles according to some implementations of the present disclosure. In FIG. 11A, silicon particles 1110 are acquired. In FIG. 11B, an interlayer layer 1112 is deposited. The interlayer layer 1112 could be a material like LiF or MgF that unpins the Fermi level (i.e., reduces band bending in the silicon) at a silicon-metal interface or a material like MoOx or NiOx that reduces the contact resistance between the silicon particle and a metal. The interlayer layer 1112 could be 0.5-20 nm thick (e.g., 1-5 nm thick). The interlayer layer 1112 could be deposited by atomic layer deposition (at or below atmospheric pressure), chemical vapor deposition (at or below atmospheric pressure), physical vapor deposition, spray pyrolysis, sol-gel, or coating from a liquid source. The interlayer layer 1112 could be deposited on top of an ultrathin (e.g., less than 1.5 nm) insulator like $SiO_2$ that provides excellent surface passivation but whose electronic barrier to carrier transport is thin enough to allow efficient transport by quantum tunneling. The interlayer layer 1112 could instead be deposited on top of an undoped intrinsic semiconductor like a-Si for the same reason. The interlayer layer 1112 could be thin enough (e.g., less than 10 nm) that electronic carrier transport occurs through a combination of tunneling, hopping, and electronic drift. In FIG. 11C, the silicon particles 1110 are embedded on a metal foil layer 1114. In FIG. 11D, the interlayer layer 1112 is partially removed to reveal part of the silicon particle 1110. In FIG. 11E, a passivating dielectric layer 1116 is deposited. If the interlayer layer 1112 is deposited on top of another layer, and this first layer is not removed, the passivating dielectric layer 1116 could be insulating but not passivating. In FIG. 11E, some the passivating dielectric layer 1116 is removed to reveal part of the silicon particle 1110. In FIG. 11F, an electron transport layer or a hole transport layer or a tunnel interlayer is deposited on the exposed silicon particle (i.e., layer 1118). In FIG. 11F, a transparent conductor layer 1120 is deposited. In FIG. 11G, the cell is laminated (i.e., layer 1122).

Figure 12G:
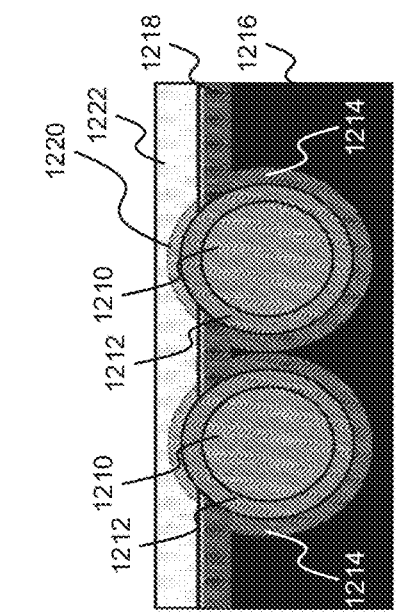
FIGS. 12A-12H are flow chart diagrams illustrating a method for fabricating a photovoltaic device using silicon particles, in accordance with some implementations of the present disclosure.
Figure 12H:
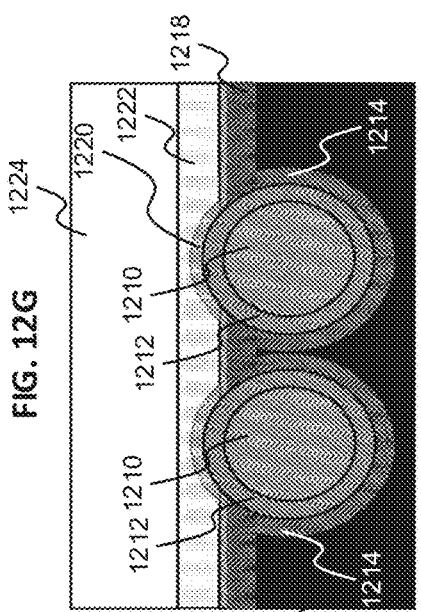
Figure 12D:
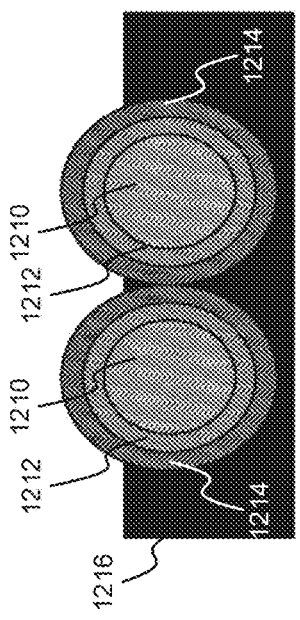
Figure 12E:
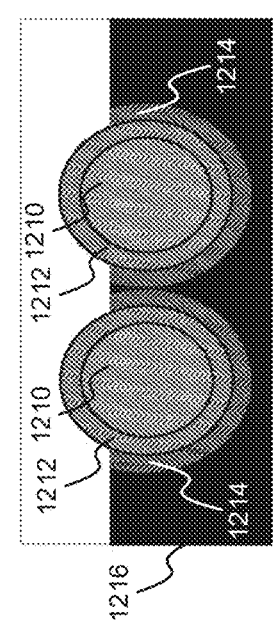
Figure 12F:
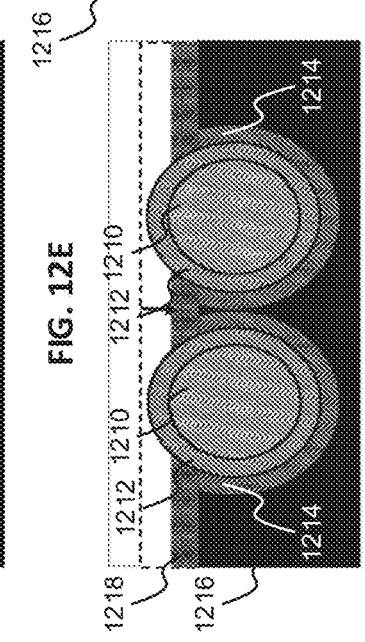
Figures 12A, 12B:
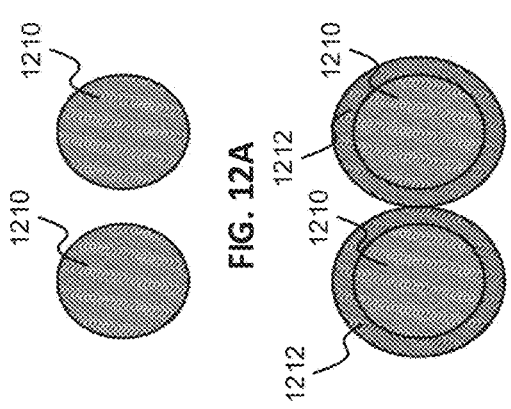
Figure 12C:
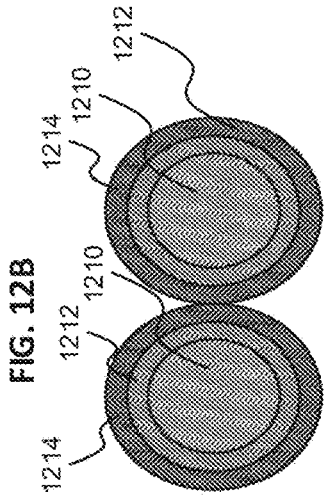

FIGS. 12A-12H illustrate a method of fabricating a photovoltaic device using silicon particles according to some implementations of the present disclosure. In FIG. 12A, silicon particles 1210 are acquired. In FIG. 12B, a thin passivating dielectric layer 1212 is deposited (Layer 1). In other implementations, the thin passivating dielectric layer 1212 could be an undoped intrinsic semiconductor like a-Si for the same reason. The thin passivating dielectric layer 1212 be thin enough (e.g., less than 10 nm) that electronic carrier transport occurs through a combination of tunneling, hopping, and electronic drift. In FIG. 12C, an interlayer layer 1214 is deposited. In FIG. 12D, the silicon particles 1210 are embedded on a metal foil layer 1216. In FIG. 12E, the interlayer layer 1214 is partially removed. In FIG. 12F, an insulator layer 1218 is deposited. In FIG. 12F, some of the insulator layer 1218 is removed to reveal part of the silicon particle 1210. In FIG. 12G, an electron transport layer or a hole transport layer or a tunnel interlayer is deposited on the exposed silicon particle (i.e., layer 1220). In FIG. 12G, a transparent conductor layer 1222 is deposited. In FIG. 12H, the cell is laminated (i.e., layer 1224).

Figure 13A:
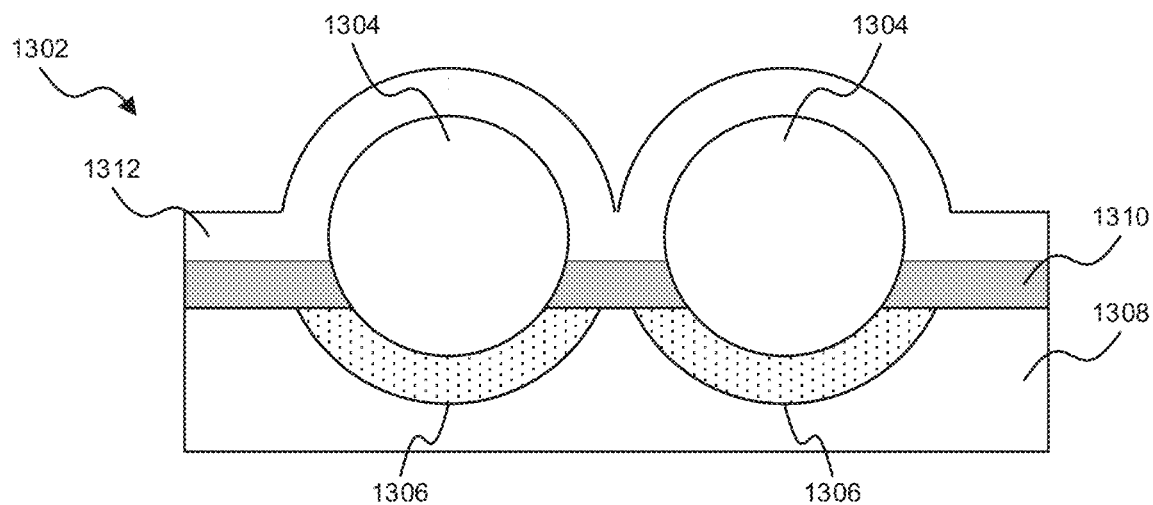
FIG. 13A is a sectional view of an example of a photovoltaic device including a single-layer coating, in accordance with some implementations of the present disclosure.
Figure 13B:
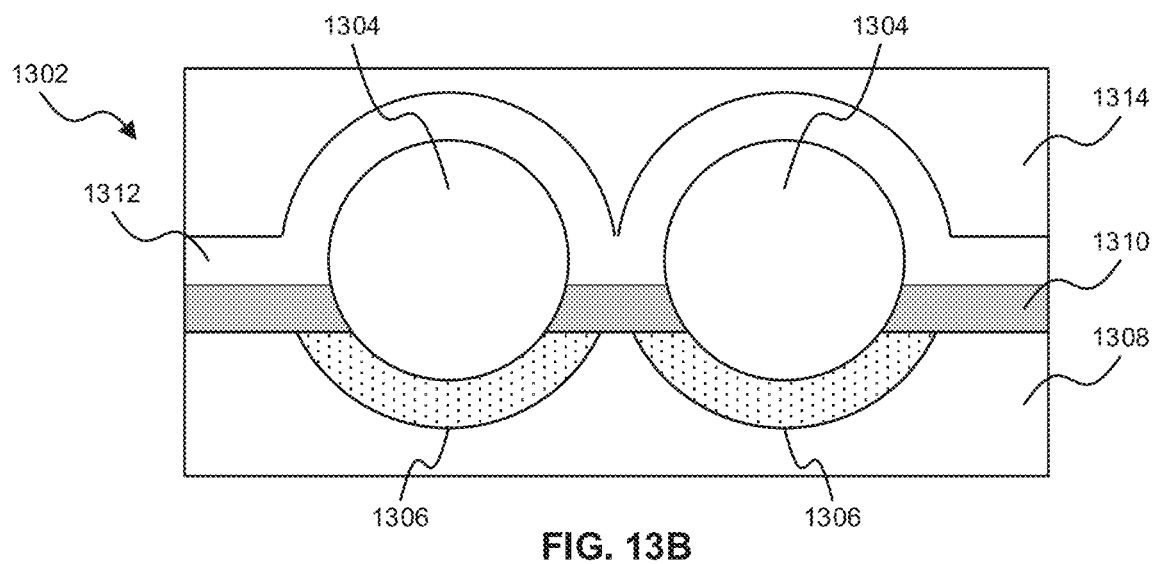
FIG. 13B is a sectional view of an example of a photovoltaic device including a transparent conductor layer, in accordance with some implementations of the present disclosure.

FIG. 13A is a sectional view of an example of a photovoltaic device 1302. The photovoltaic device 1302 illustrated in FIG. 13A includes a plurality of silicon particles 1304 (e.g., doped silicon particles), a coating layer 1306, a substrate layer 1308 (e.g., a metal layer), an insulator layer 1310 (e.g., an oxide layer), and a selective carrier transport layer 1312. The photovoltaic device 1302 may include fewer, additional, or different components in different configurations than the photovoltaic device 1302 illustrated in FIG. 13A. For example, in some implementations, the photovoltaic device 1302 may include more than two silicon particles 1304. Further, in some implementations, the photovoltaic device 1302 may further include a transparent conductor layer 1314 that is placed on the selective carrier transport layer 1312, as illustrated in FIG. 13B. The transparent conductor layer 1314 provides, e.g., lateral charge transport.

Figure 14:
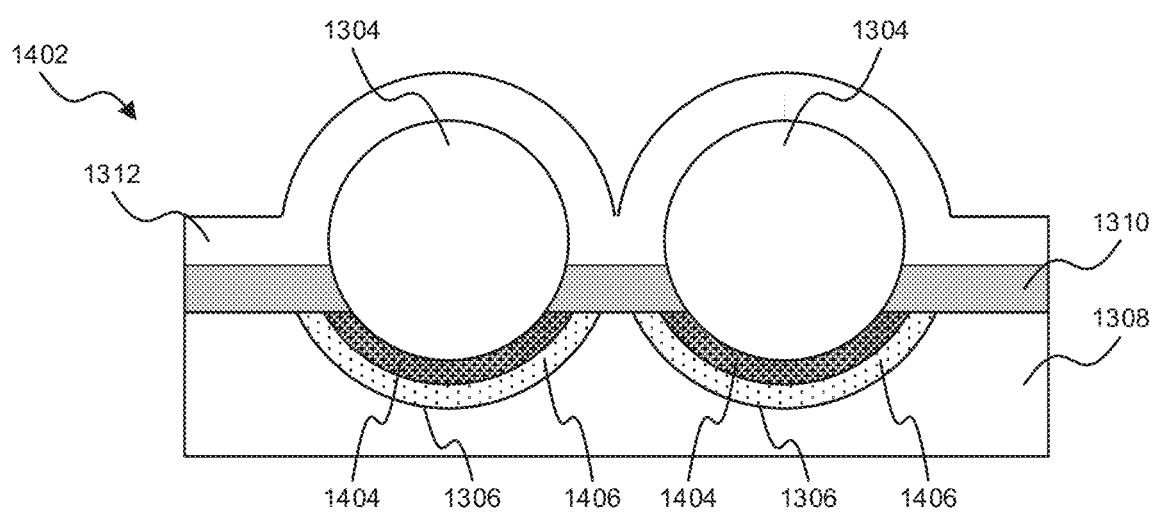
FIG. 14 is a sectional view of an example of a photovoltaic device including a multi-layer coating, in accordance with some implementations of the present disclosure.

In some implementations, the coating layer 1306 is a single layer, as illustrated in FIGS. 13A and 13B. In other implementations, the coating layer 1306 may include more than a single layer. For example, the photovoltaic device 1402 illustrated in FIG. 14 includes a coating layer 1306 with two layers (i.e., layers 1404 and 1406). In some implementations, the coating layer 1306 includes amorphous silicon. Alternatively, or in addition, the coating layer 1306 may include an oxide layer and a polysilicon layer. Alternatively, or in addition, the coating layer 1306 may include any coating previously described herein.

The coating layer 1306 and the selective carrier transport layer 1312 are designed to facilitate the flow of opposite polarity charge carriers. For example, in some implementations, the coating layer 1306 is highly-conductive for negative charge carriers and highly-resistive for positive charge carriers. Further, the selective carrier transport layer 1312 may be highly-conductive for the positive charge carriers and highly-resistive for the negative charge carriers. In other implementations, the coating layer 1306 is highly-conductive for positive charge carriers and highly-resistive for negative charge carriers. Further, the selective carrier transport layer 1312 may be highly-conductive for the negative charge carriers and highly-resistive for the positive charge carriers.

Figure 15:
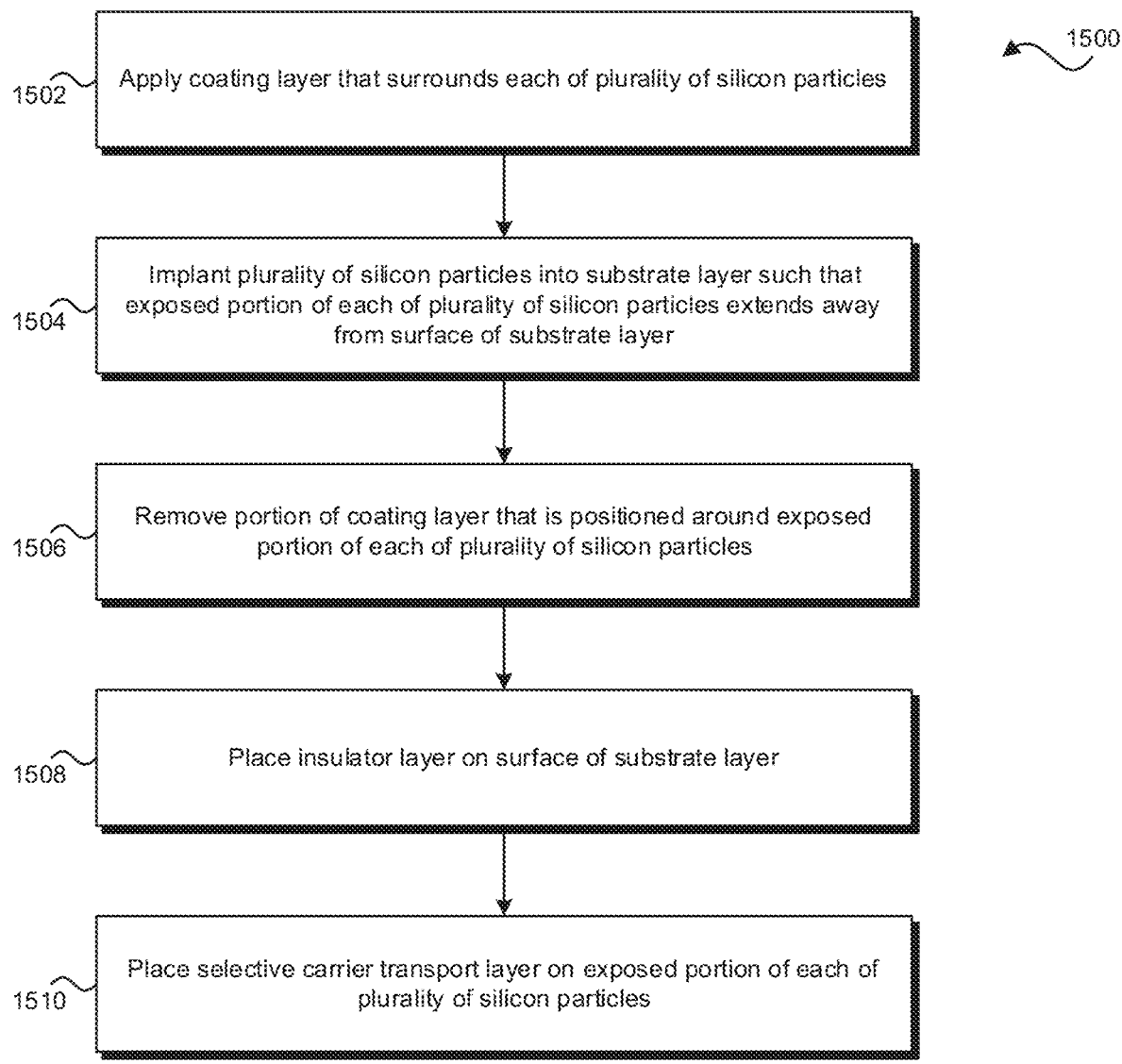
FIG. 15 is a flow diagram of an example of a method for fabricating a photovoltaic device with silicon particles having a coating that is partially etched away, in accordance with some implementations of the present disclosure.

FIG. 15 is a flow diagram of an example of a method 1500 for fabricating a photovoltaic device using silicon particles. For simplicity of explanation, method 1500 is depicted and described as a series of operations. However, operations in accordance with method 1500 can occur in various orders and/or concurrently, and/or with other operations not presented and described herein. For example, the operations depicted in method 1500 may occur in combination with any other operation of any other method disclosed herein. Furthermore, not all illustrated operations may be required to implement method 1500 in accordance with the disclosed subject matter. In addition, those skilled in the art will understand and appreciate that method 1500 could alternatively be represented via a state diagram or event diagram as a series of interrelated states.

Figure 16C:
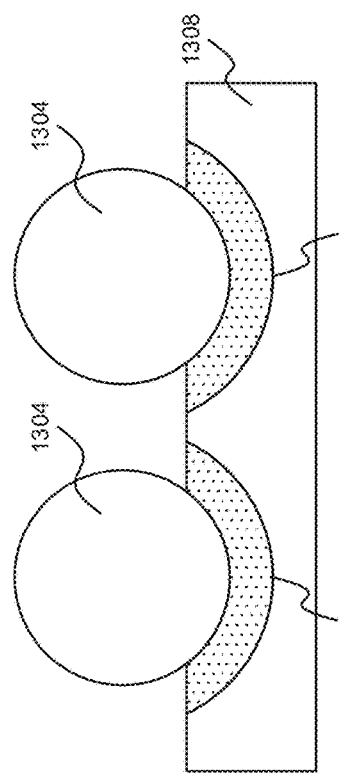
FIG. 16C is a sectional view of the coated silicon particles of FIG. 16B after a portion of the coating is removed by etching, in accordance with some implementations of the present disclosure.
Figure 16D:
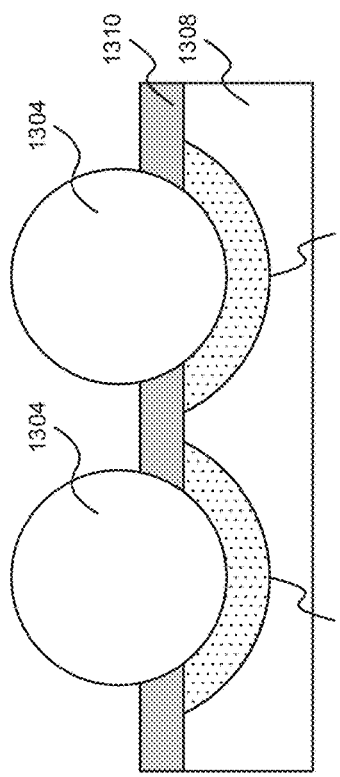
FIG. 16D is a sectional view of the coated silicon particles of FIG. 16C in which an insulator layer is placed on the substrate layer, in accordance with some implementations of the present disclosure.
Figure 16E:
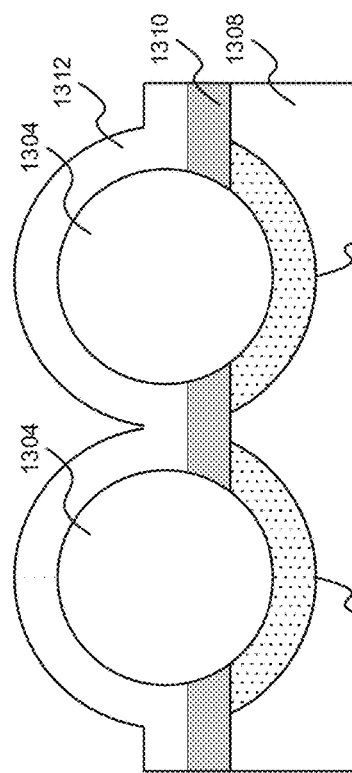
FIG. 16E is a sectional view of the coated silicon particles of FIG. 16E in which a selective carrier transport layer is placed on the insulator layer, in accordance with some implementations of the present disclosure.
Figure 16A:
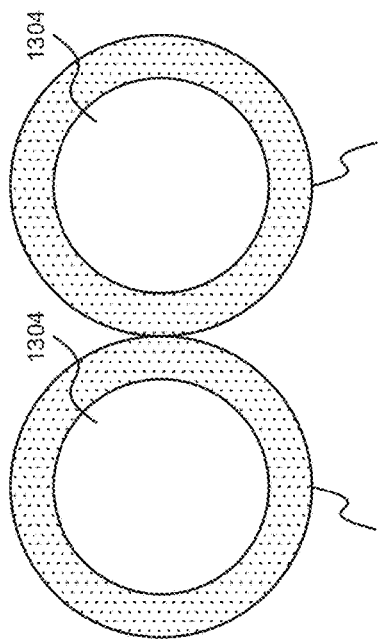
FIG. 16A is a sectional view of coated silicon particles, in accordance with some implementations of the present disclosure.
Figure 16B:
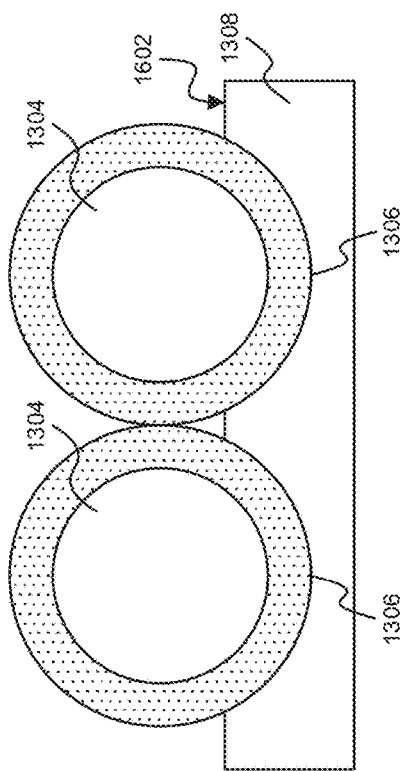
FIG. 16B is a sectional view of the coated silicon particles of FIG. 16A implanted into a substrate layer, in accordance with some implementations of the present disclosure.

At block 1502, a coating layer is applied to surround each of a plurality of silicon particles. For example, the coating layer 1306 is applied around the silicon particles 1304, as illustrated in FIG. 16A. At block 1504, the plurality of silicon particles are implanted into a substrate layer such that an exposed portion of each of the plurality of silicon particles extends away from a surface of the substrate layer. For example, the plurality of silicon particles 1304 are implanted into the substrate layer 1308 such that an exposed portion of each of the plurality of silicon particles 1304 extends away from a surface 1602 of the substrate layer 1308, as illustrated in FIG. 16B. At block 1506, a portion of the coating layer is removed. This portion of the coating layer 1306 is positioned around the exposed portion of each of the plurality of silicon particles 1304, as illustrated in FIG. 16C. At block 1508, an insulator layer is placed on the surface of the substrate layer. For example, the insulator layer 1310 is placed on the surface 1602 of the substrate layer 1308, as illustrated in FIG. 16D. At block 1510, a selective carrier transport layer is placed on the exposed portion of each of the plurality of silicon particles. For example, the selective carrier transport layer 1312 is placed on the exposed portion of each of the plurality of silicon particles 1304, as illustrated in FIG. 16E. After block 1510, other layers may be placed on the selective carrier transport layer 1312. For example, a transparent conductor layer 1314 may be placed on the selective carrier transport layer 1312, as illustrated in FIG. 13B. Alternatively, or in addition, a laminate layer (not shown) may be placed over the transparent conductor layer 1314 or over the selective carrier transport layer 1312.

Figure 17:
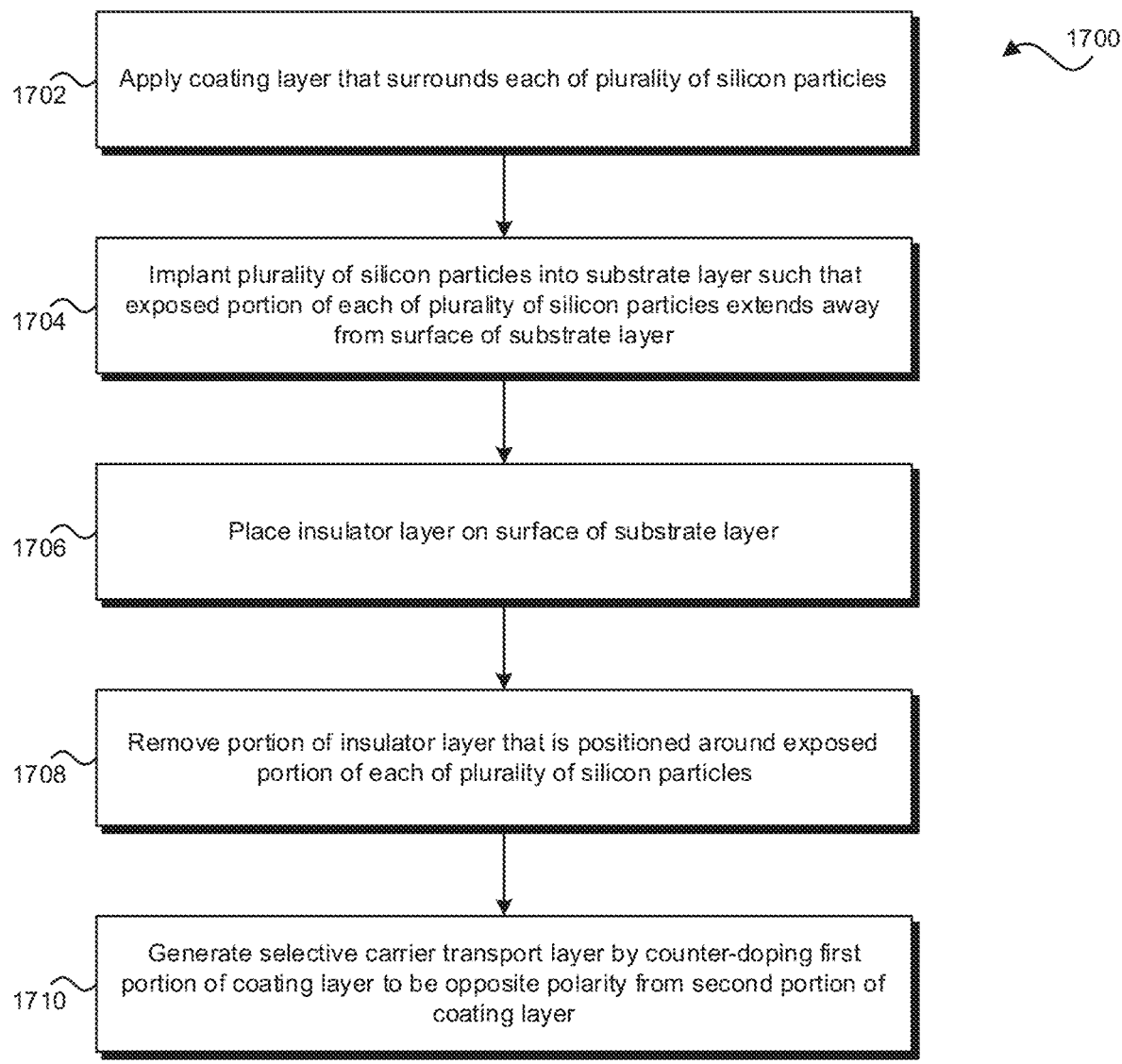
FIG. 17 is a flow diagram of an example of a method for fabricating a photovoltaic device with silicon particles having a coating that is partially doped, in accordance with some implementations of the present disclosure.
Figure 18A:
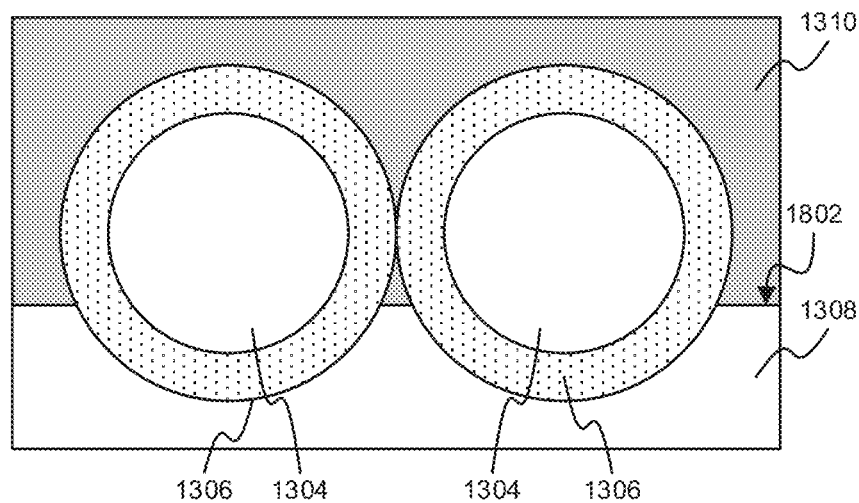
FIG. 18A is a sectional view of an insulator layer placed over coated silicon particles that are implanted into a substrate layer, in accordance with some implementations of the present disclosure.
Figure 18B:
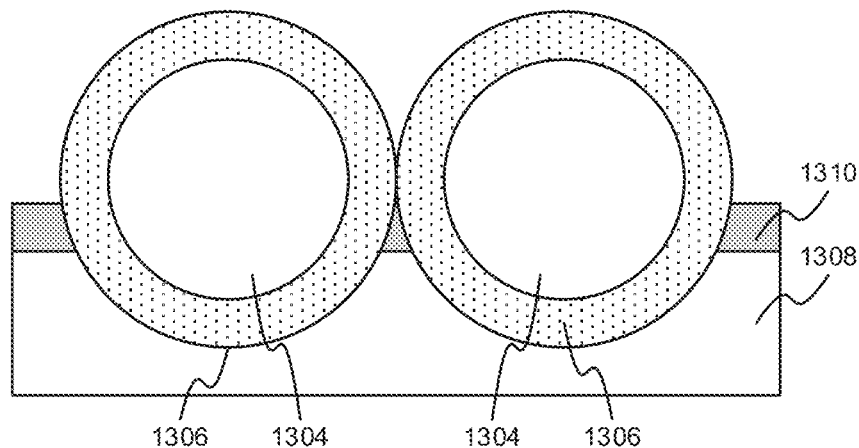
FIG. 18B is a sectional view of the coated silicon particles of FIG. 18A after a portion of the insulator layer is removed, in accordance with some implementations of the present disclosure.
Figure 18C:
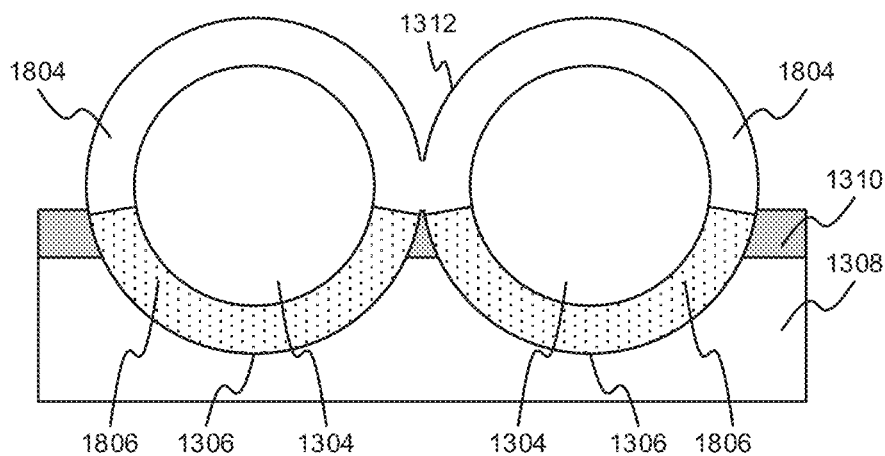
FIG. 18C is a sectional view of the coated silicon particles of FIG. 18B after a portion of the coating is counter-doped, in accordance with some implementations of the present disclosure.

FIG. 17 is a flow diagram of an example of a method 1700 for fabricating a photovoltaic device using silicon particles. At block 1702, a coating layer is applied to surround each of a plurality of silicon particles. For example, the coating layer 1306 is applied around the silicon particles 1304, as illustrated in FIG. 16A. At block 1704, the plurality of silicon particles are implanted into a substrate layer such that an exposed portion of each of the plurality of silicon particles extends away from a surface of the substrate layer. For example, the plurality of silicon particles 1304 are implanted into the substrate layer 1308 such that an exposed portion of each of the plurality of silicon particles 1304 extends away from a surface 1602 of the substrate layer 1308, as illustrated in FIG. 16B. At block 1706, an insulator layer is placed on the surface of the substrate layer. For example, the insulator layer 1310 is placed on the surface 1802 of the substrate layer 1308, as illustrated in FIG. 18A. At block 1708, a portion of the insulating layer is removed. The removed portion of the insulator layer 1310 is positioned around a portion of the coating layer 1306 that is positioned around the exposed portion of each of the plurality of silicon particles 1304, as illustrated in FIG. 18B. At block 1710, a selective carrier transport layer is generated by counter-doping a first portion of the coating layer to be an opposite polarity from a second portion of the coating layer. FIG. 18C illustrates an example implementation in which the selective carrier transport layer 1312 is generated by counter-doping a first portion 1804 of the coating layer 1306 to be an opposite polarity from a second portion 1806 of the coating layer 1306. In some implementations, the first portion 1804 of the coating layer 1306 may be highly-conductive for negative charge carriers and highly-resistive for positive charge carriers. Further, the second portion 1806 of the coating layer 1306 may be highly-conductive for the positive charge carriers and highly-resistive for the negative charge carriers. In other implementations, the first portion 1804 of the coating layer 1306 may be highly-conductive for positive charge carriers and highly-resistive for negative charge carriers. Further, the second portion 1806 of the coating layer 1306 may be highly-conductive for the negative charge carriers and highly-resistive for the positive charge carriers.

Silicon particles are approximately three to seven times smaller than silicon wafers. For example, FIG. 19 illustrates an example of the size difference between a silicon wafer 1902 and a plurality of silicon particles 1904. As illustrated in FIG. 19, the surface area of the silicon particles 1904 is a much higher relative to their total volume than the surface area of the silicon wafer 1902 relative to its total volume. Because untreated silicon surfaces and the interface of silicon with metals and many other materials are highly recombination-active, without a coating as described herein, charge carriers will recombine at too high a rate at the surface of the silicon particles 1904 to enable efficient collection of photo-excited free electrons or a high enough steady-state concentration of photo-excited free electrons to produce high current and voltage, respectively, for efficient photovoltaic power conversion. Given the relatively small surface area to volume ratio of the silicon wafer 1902, the loss of charge carriers at the surfaces does not affect the overall performance of photovoltaic devices with silicon wafers as greatly. The coatings described above (e.g., coating layer 1306) reduce recombination of photo-excited free electrons at the surface of the silicon particles 1904 by five to seven orders of magnitude, enabling greater photocurrent, operating voltage, and power generation in photovoltaic devices with the silicon particles 1904 (which are very small).

In testing, the average photoluminescence intensity for silicon wafer-based photovoltaic devices with good passivation measured 292 counts whereas the average photoluminescence intensity for photovoltaic devices using silicon particles as described herein measured 329.15 counts (i.e., about a 9% improvement). For reference, the average photoluminescence intensity for silicon wafer-based photovoltaic devices with poor passivation measured 21.33 counts and the average photoluminescence intensity for photovoltaic devices using silicon particles with poor passivation measured 7.5 counts.

Consistent with the above disclosure, the examples of systems and methods enumerated in the following clauses are specifically contemplated and are intended as a non-limiting set of examples.

Clause 1. A method for fabricating a photovoltaic device, comprising:
applying a coating layer that surrounds each of a plurality of silicon particles;
implanting the plurality of silicon particles into a substrate layer such that an exposed portion of each of the plurality of silicon particles extends away from a surface of the substrate layer;
removing a portion of the coating layer that is positioned around the exposed portion of each of the plurality of silicon particles;
placing an insulator layer on the surface of the substrate layer; and
placing a selective carrier transport layer on the exposed portion of each of the plurality of silicon particles.

Clause 2. The method of any clause herein, wherein the coating layer is highly-conductive for negative charge carriers and highly-resistive for positive charge carriers, and wherein the selective carrier transport layer is highly-conductive for the positive charge carriers and highly-resistive for the negative charge carriers.

Clause 3. The method of any clause herein, wherein the coating layer includes amorphous silicon.

Clause 4. The method of any clause herein, wherein the coating layer includes an oxide layer and a polysilicon layer.

Clause 5. The method of any clause herein, wherein a major axis of each of the plurality of silicon particles is less than 100 micrometers.

Clause 6. The method of any clause herein, further comprising:
placing a transparent conductor layer on the selective carrier transport layer for lateral charge transport.

Clause 7. The method of any clause herein, wherein the portion of the coating layer that is positioned around the exposed portion of each of the plurality of silicon particles is removed by etching.

Clause 8. A photovoltaic device, comprising:
a substrate layer including a surface;
a plurality of silicon particles implanted in the substrate layer such that an exposed portion of each of the plurality of silicon particles extends away from the surface of the substrate layer;
a coating layer positioned between each of the plurality of silicon particles and the substrate layer;
an insulator layer positioned on the surface of the substrate layer; and
a selective carrier transport layer positioned on the exposed portion of each of the plurality of the silicon particles.

Clause 9. The photovoltaic device of any clause herein, wherein the coating layer is highly-conductive for negative charge carriers and highly-resistive for positive charge carriers, and wherein the selective carrier transport layer is highly-conductive for the positive charge carriers and highly-resistive for the negative charge carriers.

Clause 10. The photovoltaic device of any clause herein, wherein the coating layer includes amorphous silicon.

Clause 11. The photovoltaic device of any clause herein, wherein the coating layer includes an oxide layer and a polysilicon layer.

Clause 12. The photovoltaic device of any clause herein, wherein a major axis of each of the plurality of silicon particles is less than 100 micrometers.

Clause 13. The photovoltaic device of any clause herein, further comprising:
a transparent conductor layer positioned on the selective carrier transport layer for lateral charge transport.

Clause 14. The photovoltaic device of any clause herein, wherein the portion of the coating layer that is positioned around the exposed portion of each of the plurality of silicon particles is removed by etching.

Clause 15. The photovoltaic device of any clause herein, wherein the coating layer is doped with an n-type dopant, wherein the coating layer surrounds each of the plurality of silicon particles, and wherein the portion of the coating layer that is positioned around the exposed portion of each of the plurality of silicon particles is doped with an p-type dopant.

Clause 16. A method for fabricating a photovoltaic device, comprising:
applying a coating layer that surrounds each of a plurality of silicon particles;
implanting the plurality of silicon particles into a substrate layer such that an exposed portion of each of the plurality of silicon particles extends away from a surface of the substrate layer;
placing an insulator layer on the surface of the substrate layer and on the exposed portion of each of the plurality of the silicon particles;
removing a portion of the insulator layer that is positioned around a portion of the coating layer that is positioned around the exposed portion of each of the plurality of silicon particles; and
generating a selective carrier transport layer by counter-doping a first portion of the coating layer to be an opposite polarity from a second portion of the coating layer, wherein the first portion of the coating layer is positioned around the exposed portion of each of the plurality of silicon particles, and wherein the second portion of the coating layer is implanted in the substrate layer.

Clause 17. The method of any clause herein, wherein the first portion of the coating layer is highly-conductive for negative charge carriers and highly-resistive for positive charge carriers, and wherein the second portion of the coating layer is highly-conductive for the positive charge carriers and highly-resistive for the negative charge carriers.

Clause 18. The method of any clause herein, wherein the coating layer includes amorphous silicon.

Clause 19. The method of any clause herein, wherein the coating layer includes an oxide layer and a polysilicon layer.

Clause 20. The method of any clause herein, wherein a major axis of each of the plurality of silicon particles is less than 100 micrometers No part of the description in this application should be read as implying that any particular element, step, or function is an essential element that must be included in the claim scope. The scope of patented subject matter is defined only by the claims. Moreover, none of the claims is intended to invoke 25 U.S.C. § 104(f) unless the exact words "means for" are followed by a participle.

The foregoing description, for purposes of explanation, use specific nomenclature to provide a thorough understanding of the described embodiments. However, it should be apparent to one skilled in the art that the specific details are not required to practice the described embodiments. Thus, the foregoing descriptions of specific embodiments are presented for purposes of illustration and description. They are not intended to be exhaustive or to limit the described embodiments to the precise forms disclosed. It should be apparent to one of ordinary skill in the art that many modifications and variations are possible in view of the above teachings.

The above discussion is meant to be illustrative of the principles and various embodiments of the present disclosure. Once the above disclosure is fully appreciated, numerous variations and modifications will become apparent to those skilled in the art. It is intended that the following claims be interpreted to embrace all such variations and modifications.

What is claimed is:

1. A method for fabricating a photovoltaic device, comprising:
applying a coating layer that surrounds each of a plurality of silicon particles, wherein the coating layer is applied to the plurality of silicon particles by deposition;
implanting the plurality of silicon particles into a substrate layer such that an exposed portion of each of the plurality of silicon particles extends away from a surface of the substrate layer;
removing a portion of the coating layer that is positioned around the exposed portion of each of the plurality of silicon particles;
placing an insulator layer on the surface of the substrate layer; and
placing a selective carrier transport layer on the exposed portion of each of the plurality of silicon particles,
wherein the coating layer includes an oxide layer and a polysilicon layer, and wherein the oxide layer is positioned between each of the plurality of silicon particles and the polysilicon layer.

2. The method of claim 1, wherein the coating layer is highly-conductive for negative charge carriers and highly-resistive for positive charge carriers, and wherein the selective carrier transport layer is highly-conductive for the positive charge carriers and highly-resistive for the negative charge carriers.

3. The method of claim 1, further comprising:
placing a transparent conductor layer on the selective carrier transport layer for lateral charge transport.

4. The method of claim 1, wherein the portion of the coating layer that is positioned around the exposed portion of each of the plurality of silicon particles is removed by etching.

5. A photovoltaic device, comprising:
a substrate layer including a surface;
a plurality of silicon particles implanted in the substrate layer such that an exposed portion of each of the plurality of silicon particles extends away from the surface of the substrate layer;
a coating layer positioned between each of the plurality of silicon particles and the substrate layer, wherein the coating layer is applied to the plurality of silicon particles by deposition;
an insulator layer positioned on the surface of the substrate layer; and
a selective carrier transport layer positioned on the exposed portion of each of the plurality of the silicon particles,
wherein the coating layer includes an oxide layer and a polysilicon layer, and wherein the oxide layer is positioned between each of the plurality of silicon particles and the polysilicon layer.

6. The photovoltaic device of claim 5, wherein the coating layer is highly-conductive for negative charge carriers and highly-resistive for positive charge carriers, and wherein the selective carrier transport layer is highly-conductive for the positive charge carriers and highly-resistive for the negative charge carriers.

7. The photovoltaic device of claim 5, further comprising:
a transparent conductor layer positioned on the selective carrier transport layer for lateral charge transport.

8. The photovoltaic device of claim 5, wherein the portion of the coating layer that is positioned around the exposed portion of each of the plurality of silicon particles is removed by etching.

9. The photovoltaic device of claim 5, wherein the coating layer is doped with an n-type dopant, wherein the coating layer surrounds each of the plurality of silicon particles, and wherein the portion of the coating layer that is positioned around the exposed portion of each of the plurality of silicon particles is doped with an p-type dopant.

10. A method for fabricating a photovoltaic device, comprising:
applying a coating layer that surrounds each of a plurality of silicon particles;
implanting the plurality of silicon particles into a substrate layer such that an exposed portion of each of the plurality of silicon particles extends away from a surface of the substrate layer;
placing an insulator layer on the surface of the substrate layer and on the exposed portion of each of the plurality of the silicon particles;
removing a portion of the insulator layer that is positioned around a portion of the coating layer that is positioned around the exposed portion of each of the plurality of silicon particles; and
generating a selective carrier transport layer by counter-doping a first portion of the coating layer to be an opposite polarity from a second portion of the coating layer, wherein the first portion of the coating layer is positioned around the exposed portion of each of the plurality of silicon particles, and wherein the second portion of the coating layer is implanted in the substrate layer.

11. The method of claim 10, wherein the first portion of the coating layer is highly-conductive for negative charge carriers and highly-resistive for positive charge carriers, and wherein the second portion of the coating layer is highly-conductive for the positive charge carriers and highly-resistive for the negative charge carriers.

12. The method of claim 10, wherein the coating layer includes amorphous silicon.

13. The method of claim 10, wherein the coating layer includes an oxide layer and a polysilicon layer.

14. The method of claim 10, wherein a major axis of each of the plurality of silicon particles is less than 100 micrometers.

15. The method of claim 1, wherein the coating layer is applied to the plurality of silicon particles before the plurality of silicon particles are implanted into the substrate layer.

16. The photovoltaic device of claim 5, further comprising an interlayer layer positioned between the coating layer and the substrate layer, wherein the interlayer layer forms an ohmic contact between each of the plurality of silicon particles and the substrate layer.

* * * * *